(12) United States Patent
Horiba et al.

(10) Patent No.: US 8,395,232 B2
(45) Date of Patent: Mar. 12, 2013

(54) SEMICONDUCTOR DEVICE AND METHOD OF MANUFACTURING THE SAME

(75) Inventors: Shinichi Horiba, Tokyo (JP); Nobuyuki Nakamura, Tokyo (JP); Eiji Kitamura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 195 days.

(21) Appl. No.: 12/805,129

(22) Filed: Jul. 14, 2010

(65) Prior Publication Data

US 2011/0018066 A1    Jan. 27, 2011

(30) Foreign Application Priority Data

Jul. 22, 2009    (JP) ................................ P2009-171462

(51) Int. Cl.
*H01L 23/525* (2006.01)
(52) U.S. Cl. ................. 257/530; 257/E23.147; 438/131
(58) Field of Classification Search .................. 257/529, 257/530, E23.146, E23.147; 438/128–131
See application file for complete search history.

(56) References Cited

U.S. PATENT DOCUMENTS

| | | | |
|---|---|---|---|
| 7,126,204 B2 * | 10/2006 | Frey et al. ..................... | 257/529 |
| 7,601,564 B2 | 10/2009 | Okayama | |
| 7,615,813 B2 * | 11/2009 | Fukuzumi et al. ............ | 257/288 |
| 2007/0170427 A1 | 7/2007 | Saino | |
| 2008/0182367 A1 * | 7/2008 | Petti .............................. | 438/142 |
| 2009/0008741 A1 | 1/2009 | Okayama | |
| 2009/0008742 A1 | 1/2009 | Okayama | |
| 2009/0321790 A1 | 12/2009 | Okayama | |

FOREIGN PATENT DOCUMENTS

| | | |
|---|---|---|
| JP | 2005-260217 A | 9/2005 |
| JP | 2007-194486 A | 8/2007 |

* cited by examiner

*Primary Examiner* — Julio J Maldonado
*Assistant Examiner* — Daniel Shook
(74) *Attorney, Agent, or Firm* — McGinn IP Law Group, PLLC

(57) ABSTRACT

A semiconductor device includes an antifuse element. The semiconductor device includes a first well of a first conductivity type disposed in a semiconductor substrate; a first insulating film on the first well; a first conductive film of the first conductivity type on the first insulating film; and an impurity-introduced region of the first conductivity type. The impurity-introduced region of the first conductivity type in the first well is higher in impurity concentration than the first well. The impurity-introduced region includes a first portion that faces toward the first conductive film through the first insulating film.

20 Claims, 27 Drawing Sheets

FIG. 3
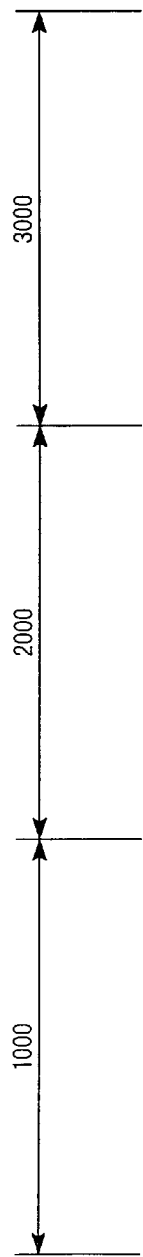
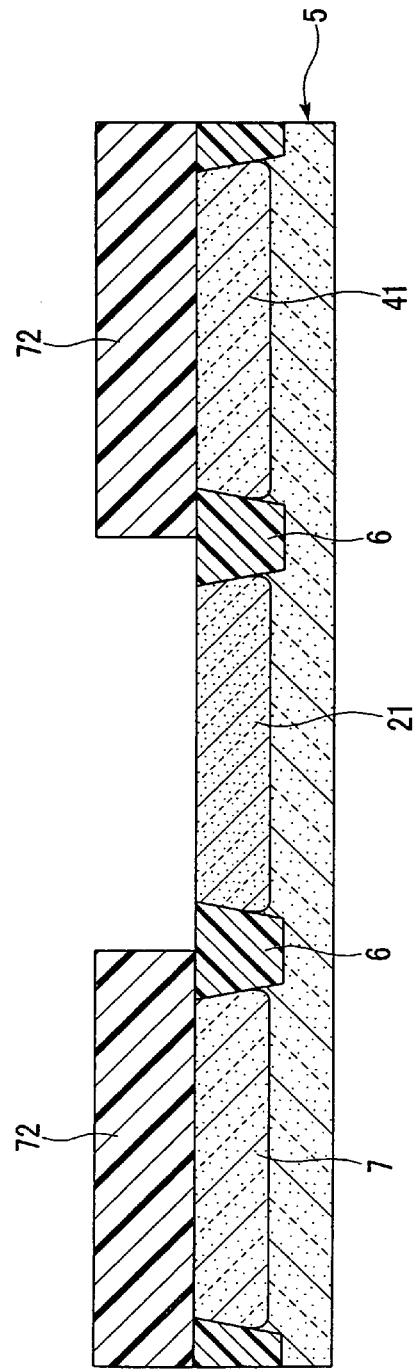

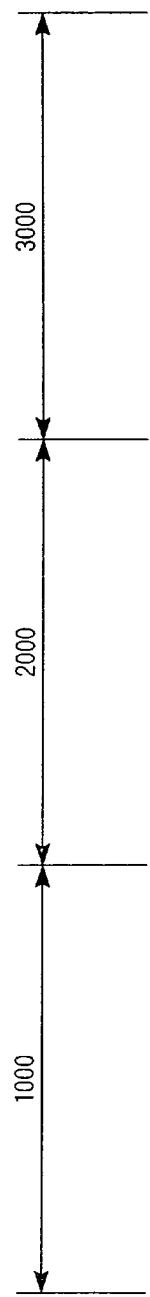
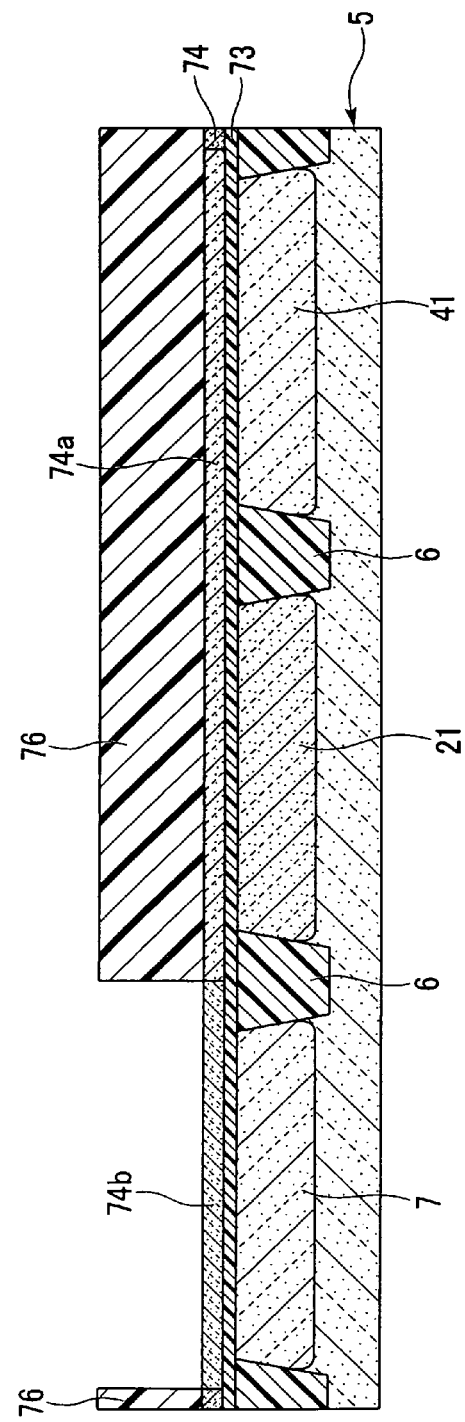
FIG. 5 ic device and a method of manufacturing the same.

Priority is claimed on Japanese Patent Application No. 2009-171462, filed Jul. 22, 2009, the content of which is incorporated herein by reference.

2. Description of the Related Art

In general, the process for manufacturing a semiconductor device may include the following final process. Circuit connection information is updated. Particular circuit operations are performed in order to recover operational faults having been caused by a manufacturing process as well as to switch circuit functions.

A technique has been known to provide fuses in a semiconductor product. The fuses changes circuit connections. A particular external signal is input into the semiconductor product, in order to change the conductive states of the fuses for allowing the semiconductor product to perform desired circuit operations.

The fuse having the above-described function is known as an antifuse which will be referred to as an electrical fuse. The antifuse may be placed in a non-conductive state in an initial state and may be changed to a conductive state in response to an external signal input.

Japanese Unexamined Patent Application Publication No. 2005-260217 discloses that a technique has been known to form a fuse element having substantially the same structure as a MOS type transistor and to change the conductive state by the presence/absence of breakdown of a gate insulating film when the above-described antifuse is formed on a semiconductor device having the MOS type transistor.

Japanese Unexamined Patent Application Publication No. 2007-194486 discloses that when the antifuse is formed in combination with the MOS type transistor, it is important to avoid any further increase in the number of manufacturing processes necessary to form antifuse elements. In this point of view, a method of forming an antifuse element has been proposed. The common process can form both the antifuse element and a MOS type transistor.

Japanese Unexamined Patent Application Publication No. 2007-194486 discloses that the antifuse element does not affect a resistance value after a connection by setting both a conductivity type of gate electrode and a conductivity type of region facing through the gate insulating film to the same conductivity type such as P-type. This has been made in view of the fact that a PN junction is formed upon connection when the gate electrode has a conductivity type different from a lower region, and the connection resistance is greatly increased.

SUMMARY

In one embodiment, a semiconductor device may include, but is not limited to, an antifuse element. The antifuse element may include, but is not limited to, a first well of a first conductivity type disposed in a semiconductor substrate; a first insulating film on the first well; a first conductive film of the first conductivity type on the first insulating film; and an impurity-introduced region of the first conductivity type. The impurity-introduced region in the first well is higher in impurity concentration than the first well. The impurity-introduced region includes a first portion that faces toward the first conductive film through the first insulating film.

In another embodiment, a semiconductor device may include, but is not limited to, a semiconductor substrate; a first MOS transistor; a second MOS transistor; and an antifuse element. The first MOS transistor of a first conductivity type may be disposed on the semiconductor substrate. The first MOS transistor may include, but is not limited to, a first well, a first gate insulating film, a first gate electrode, first source and drain regions, and first lightly doped drain regions. The second MOS transistor may include, but is not limited to, a second well, a second gate insulating film, a second gate electrode, second source and drain regions, and second lightly doped drain regions. The first well may be of a second conductivity type. The first MOS transistor may include, but is not limited to, a first channel region of the first MOS transistor. The first gate insulating film may be disposed on the first well. The first gate electrode may include, but is not limited to, a first conductive film. The first gate electrode may be disposed on the first gate insulating film. The first source/drain regions of the first conductivity type may be disposed in the first well. The first lightly doped drain regions of the first conductivity type may be disposed in the first well. The MOS second transistor of the second conductivity type may be disposed on the semiconductor substrate. The second MOS transistor may include, but is not limited to, a second well, a second gate insulating film, a second gate electrode, second source and drain regions, and second lightly doped drain regions. The second well may be of the first conductivity type. The second well may include, but is not limited to, a second channel region of the second MOS transistor. The second gate insulating film may be disposed on the second well. The second gate electrode may include, but is not limited to, a second conductive film. The second gate electrode of the second conductivity type may be disposed on the second gate insulating film. The second source/drain regions of the second conductivity type may be disposed in the second well. The antifuse element may be disposed on the semiconductor substrate. The antifuse element may include, but is not limited to, a third well, a third insulating film, a third conductive film, an impurity-introduced region. The third well may be of the first conductivity type. The third insulating film may be disposed on the third well. The third conductive film of the first conductivity type may be disposed on the first insulating film. The impurity-introduced region of the first conductivity type may be higher in impurity concentration than the third well.

In still another embodiment, a semiconductor device may include, but is not limited to, an antifuse element. The antifuse element may include, but is not limited to, a first well, a first insulating film, a first conductive film, and an impurity-introduced region. The first well may be of a first conductivity type. The first insulating film may be disposed on the first well. The first conductive film may be of the first conductivity type and disposed on the first insulating film. The first impurity region of the first conductivity type may be disposed in the first well. The first impurity region may be higher in impurity concentration than the first well. The second impurity region of the second conductivity type may be disposed in the first well. The second impurity region may be higher in impurity concentration than the first impurity region. The second impurity region may be disposed outside the first impurity region.

BRIEF DESCRIPTION OF THE DRAWINGS

The above features and advantages of the present invention will be more apparent from the following description of cer-

SEMICONDUCTOR DEVICE AND METHOD OF MANUFACTURING THE SAME

BACKGROUND OF THE INVENTION

1. Field of the Invention

Figure 1:
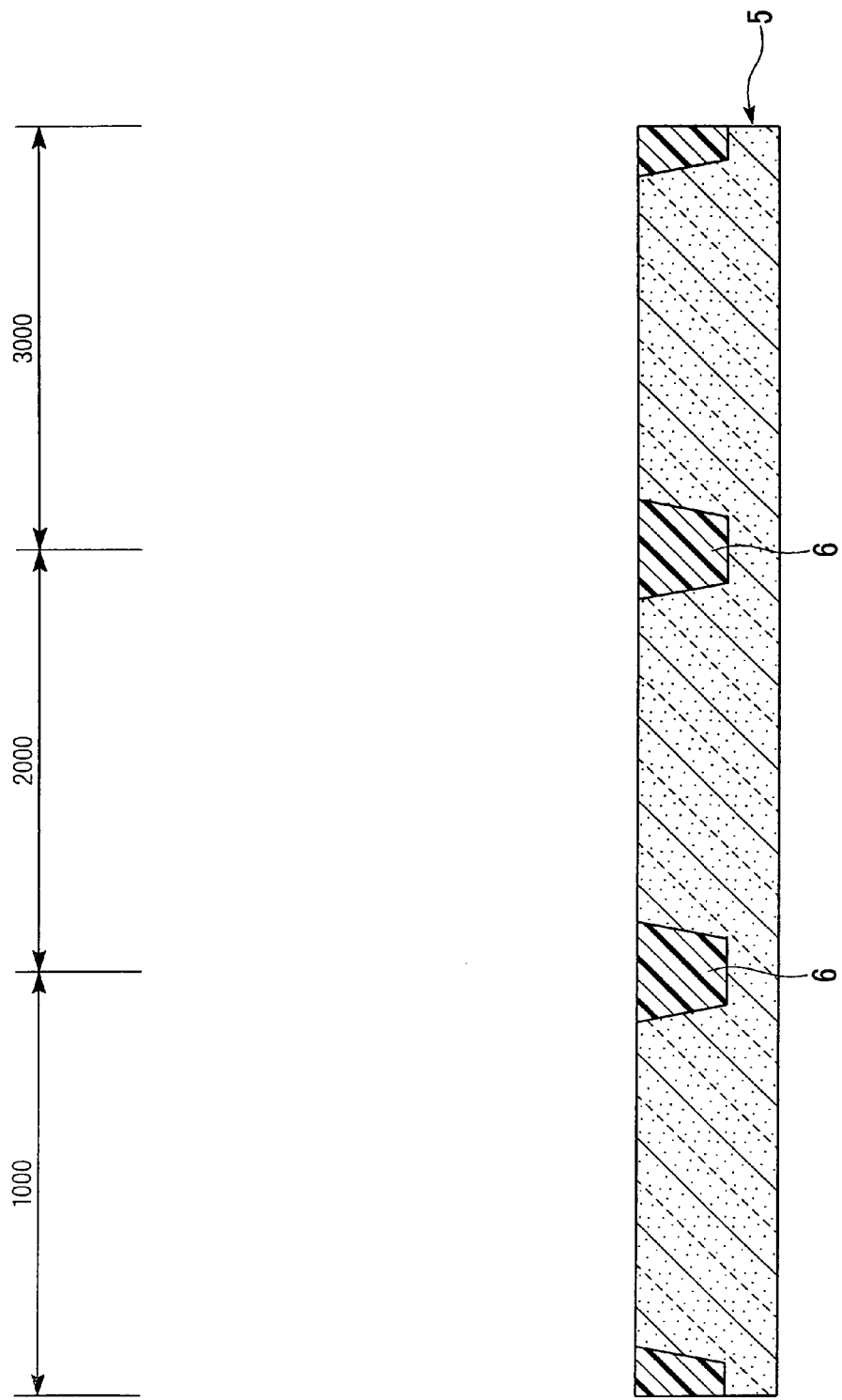
Figure 2:
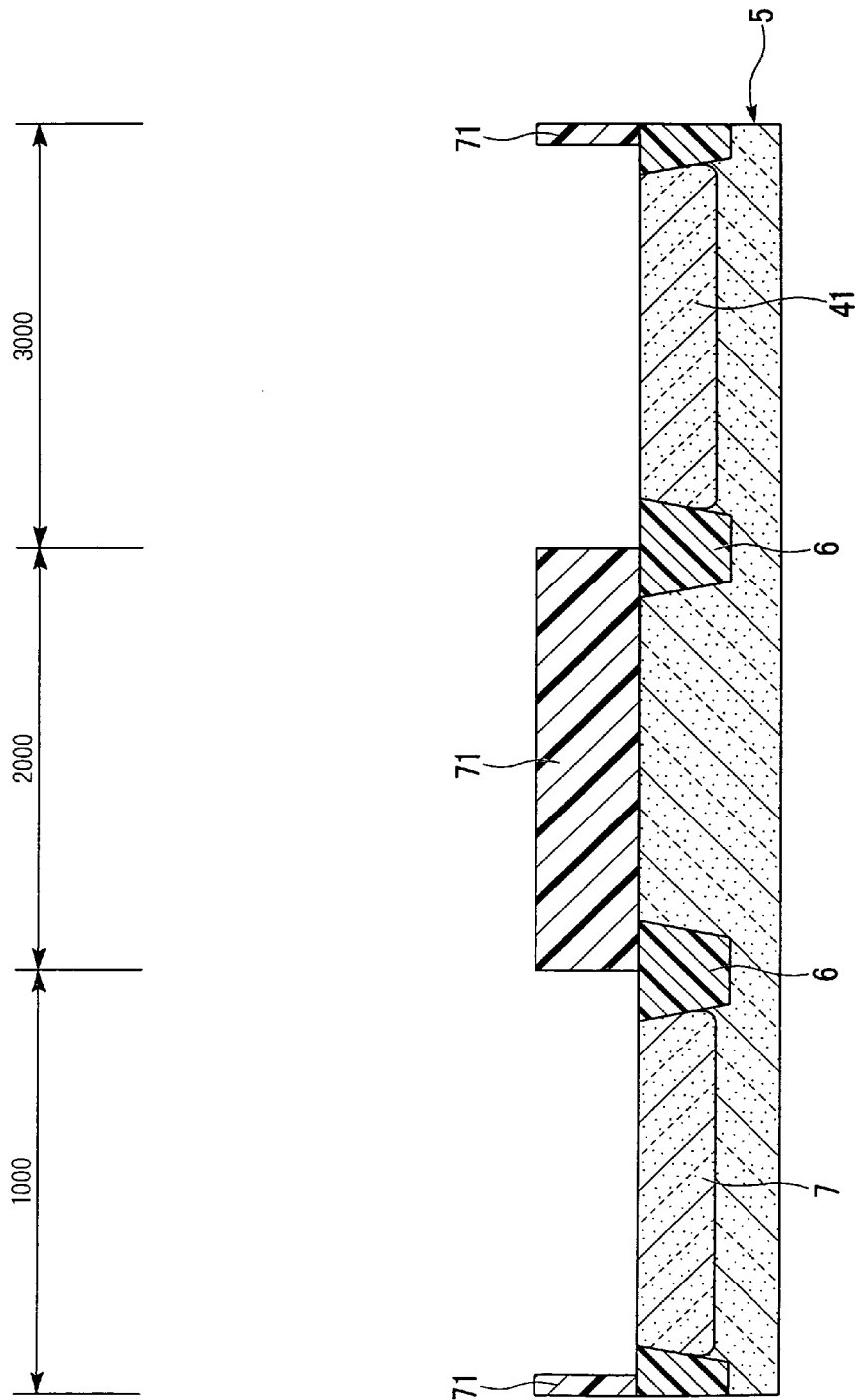
Figure 4:
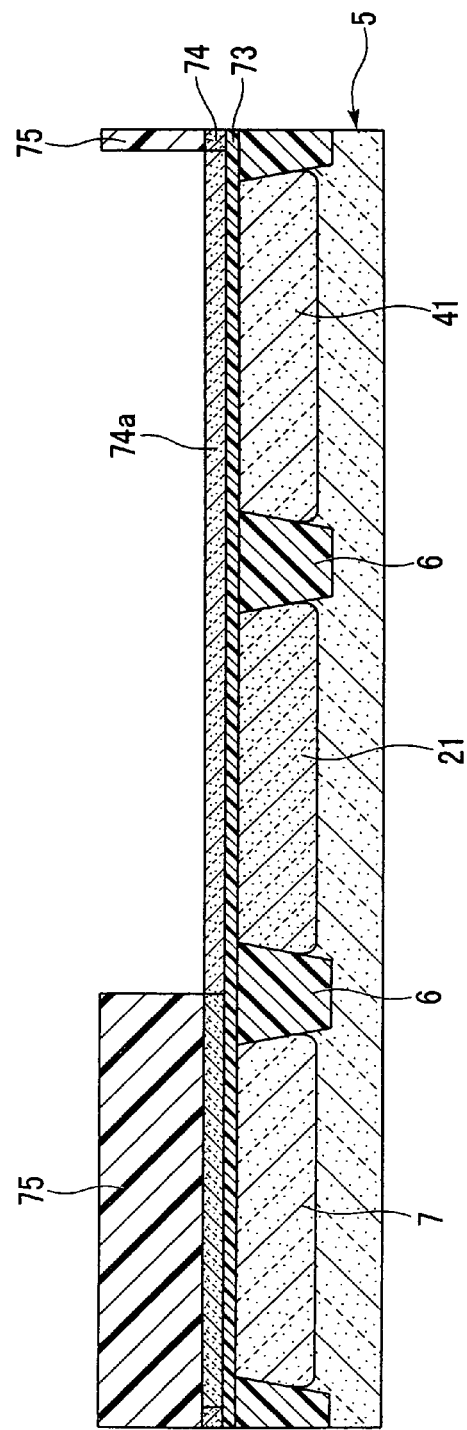
Figure 6:
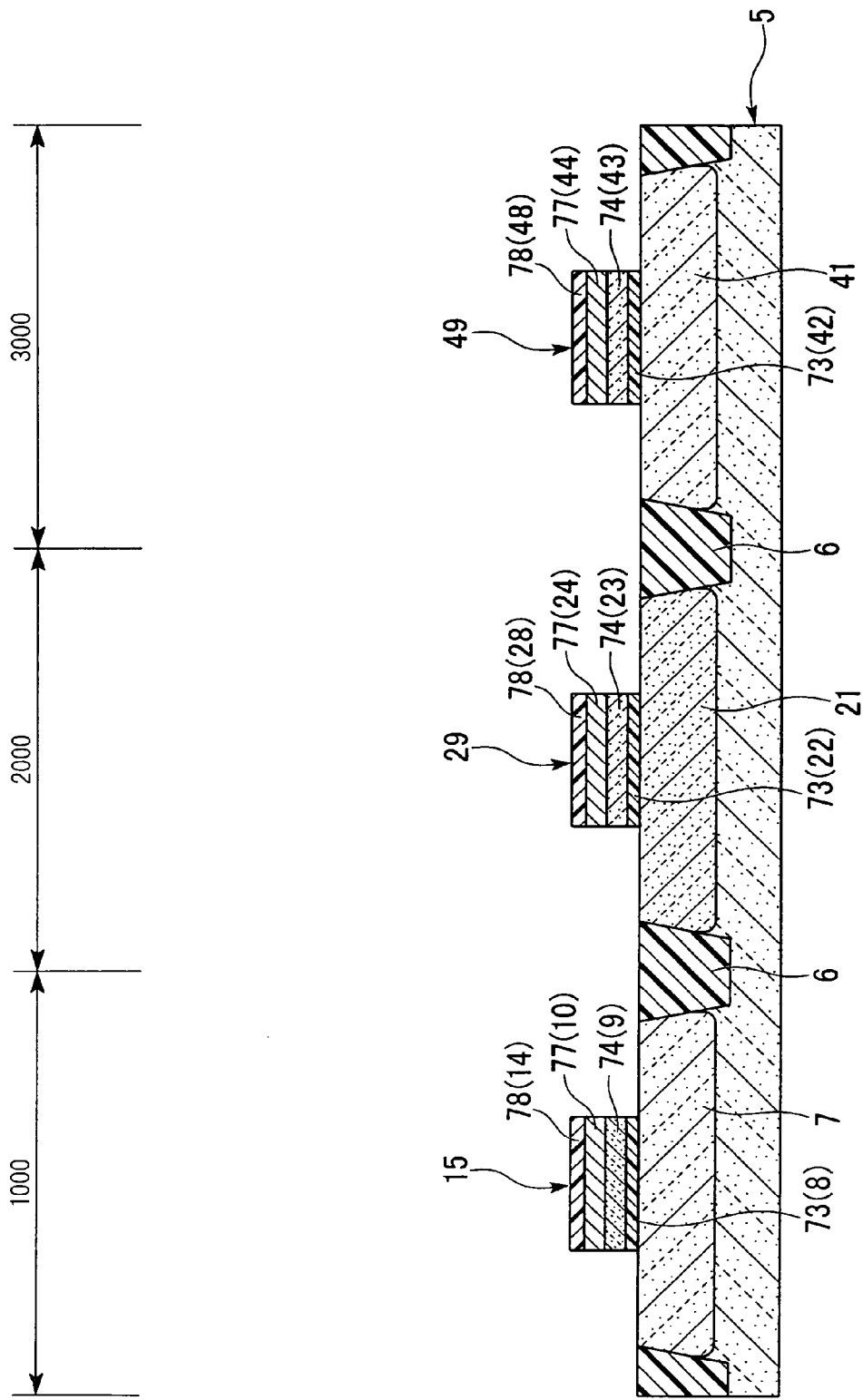
Figure 7:
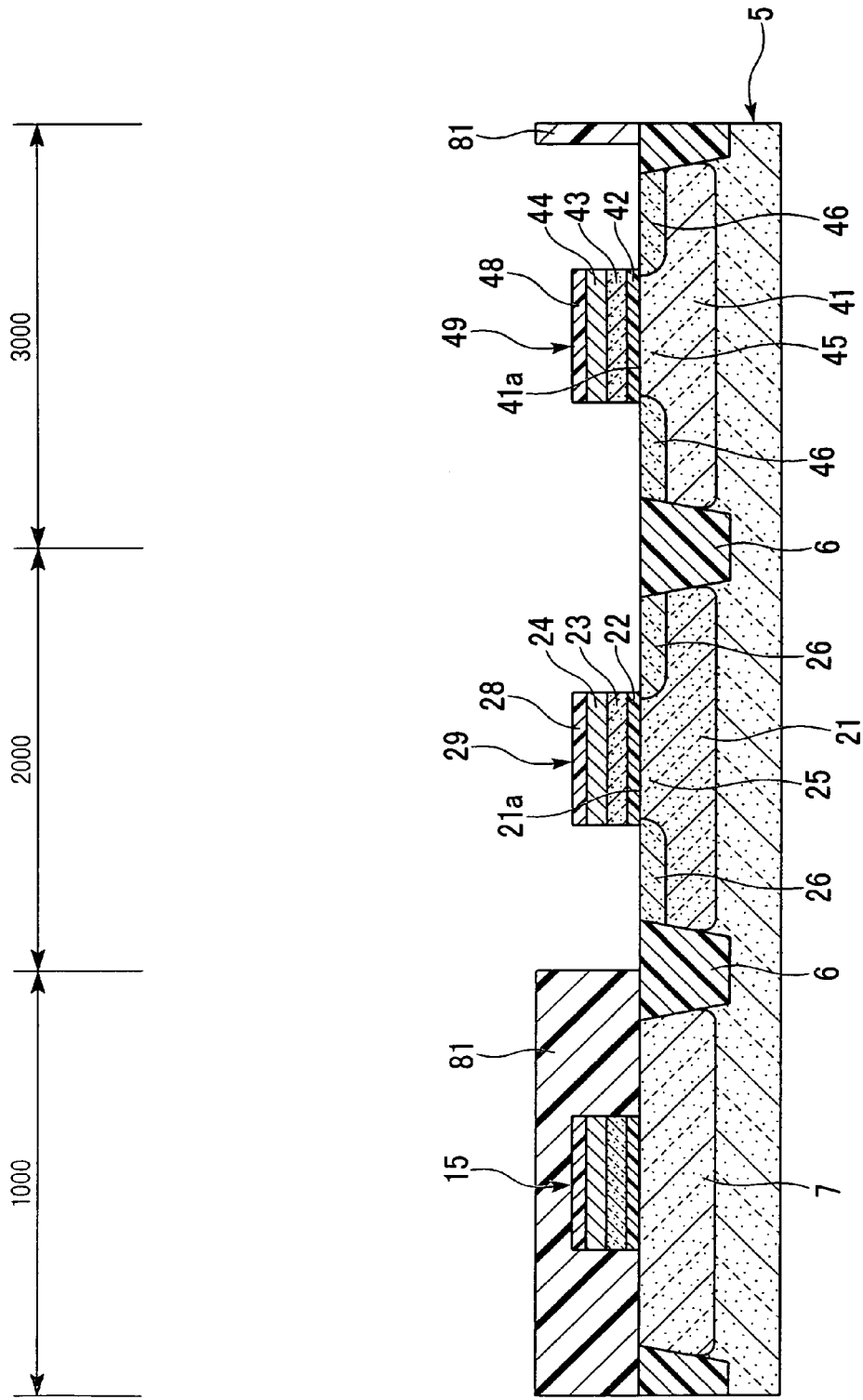
Figure 8:
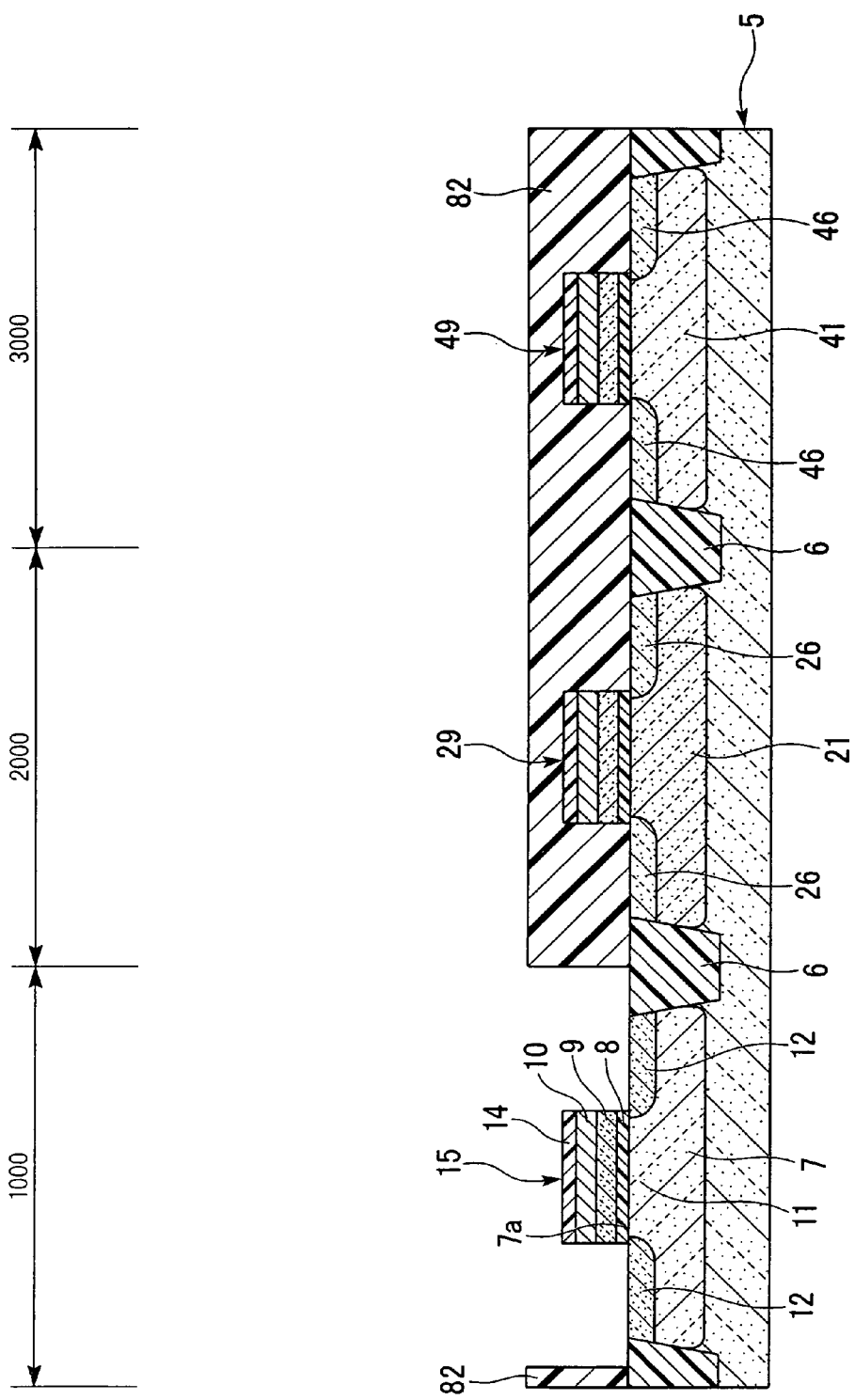
Figure 9:
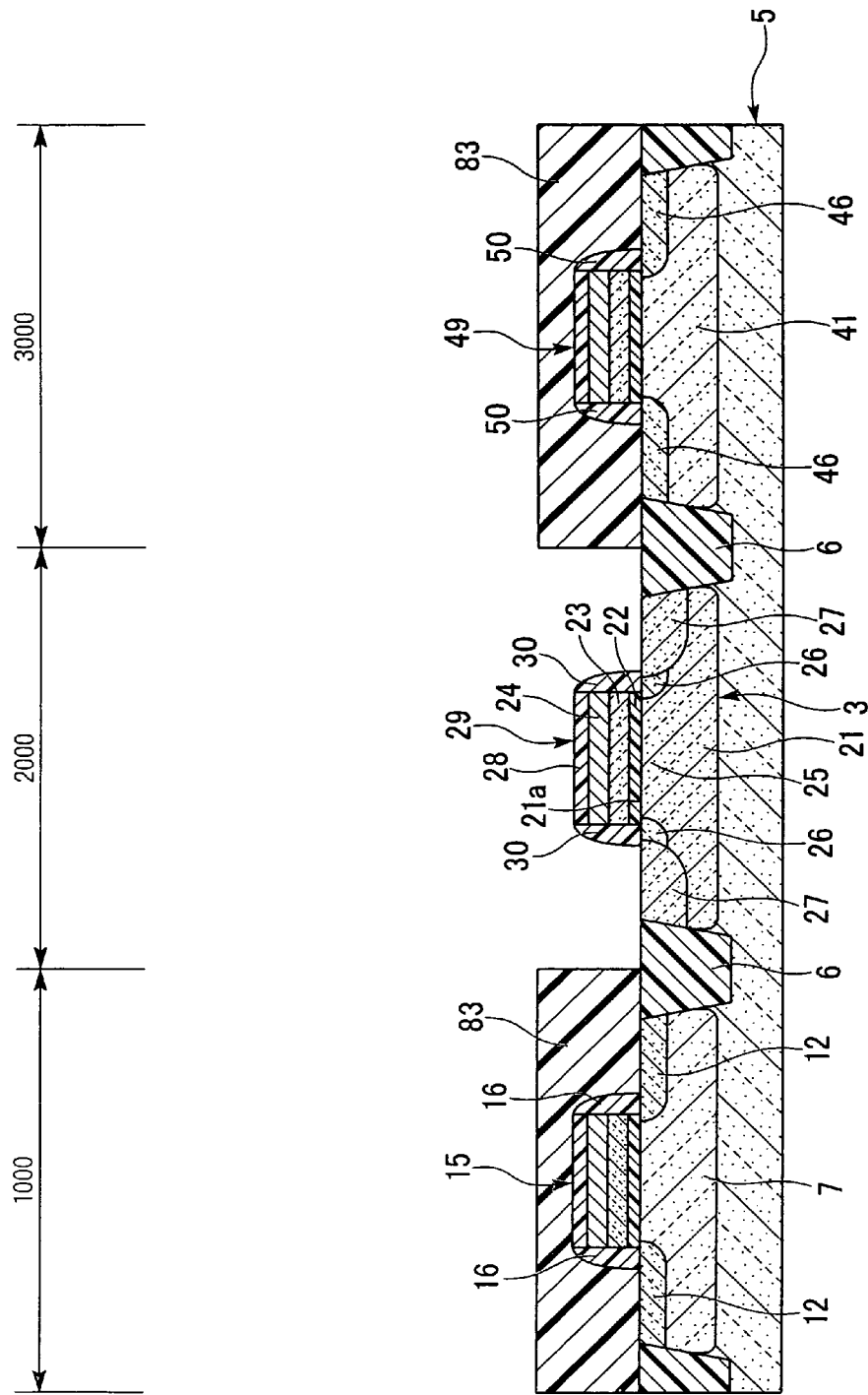
Figure 10:
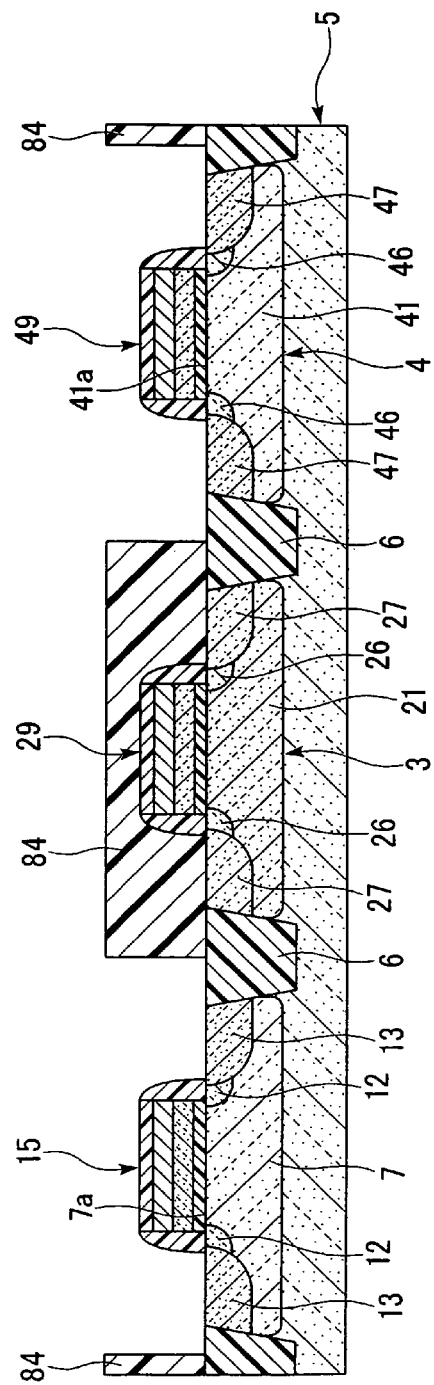
Figure 11:
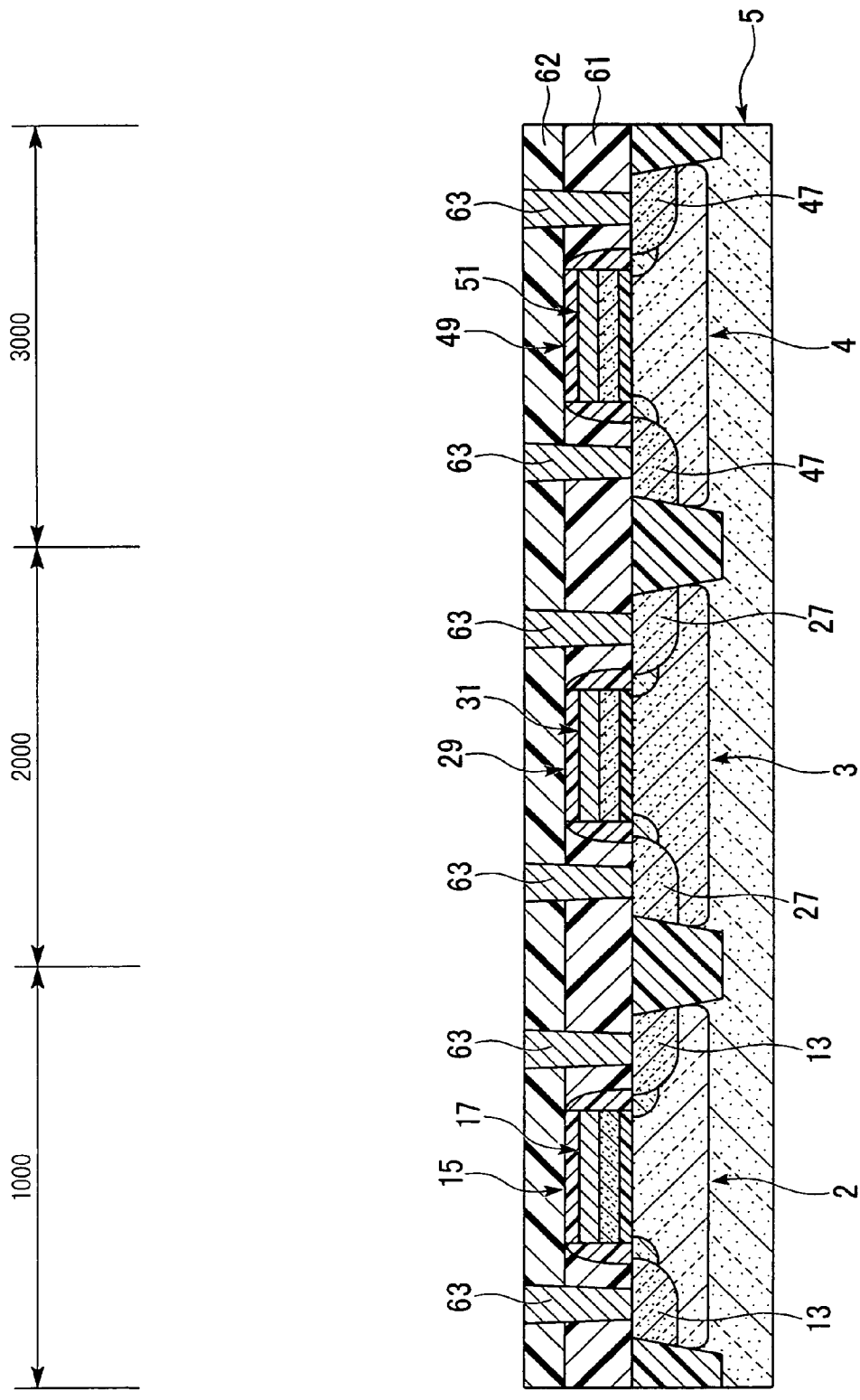
Figure 12:
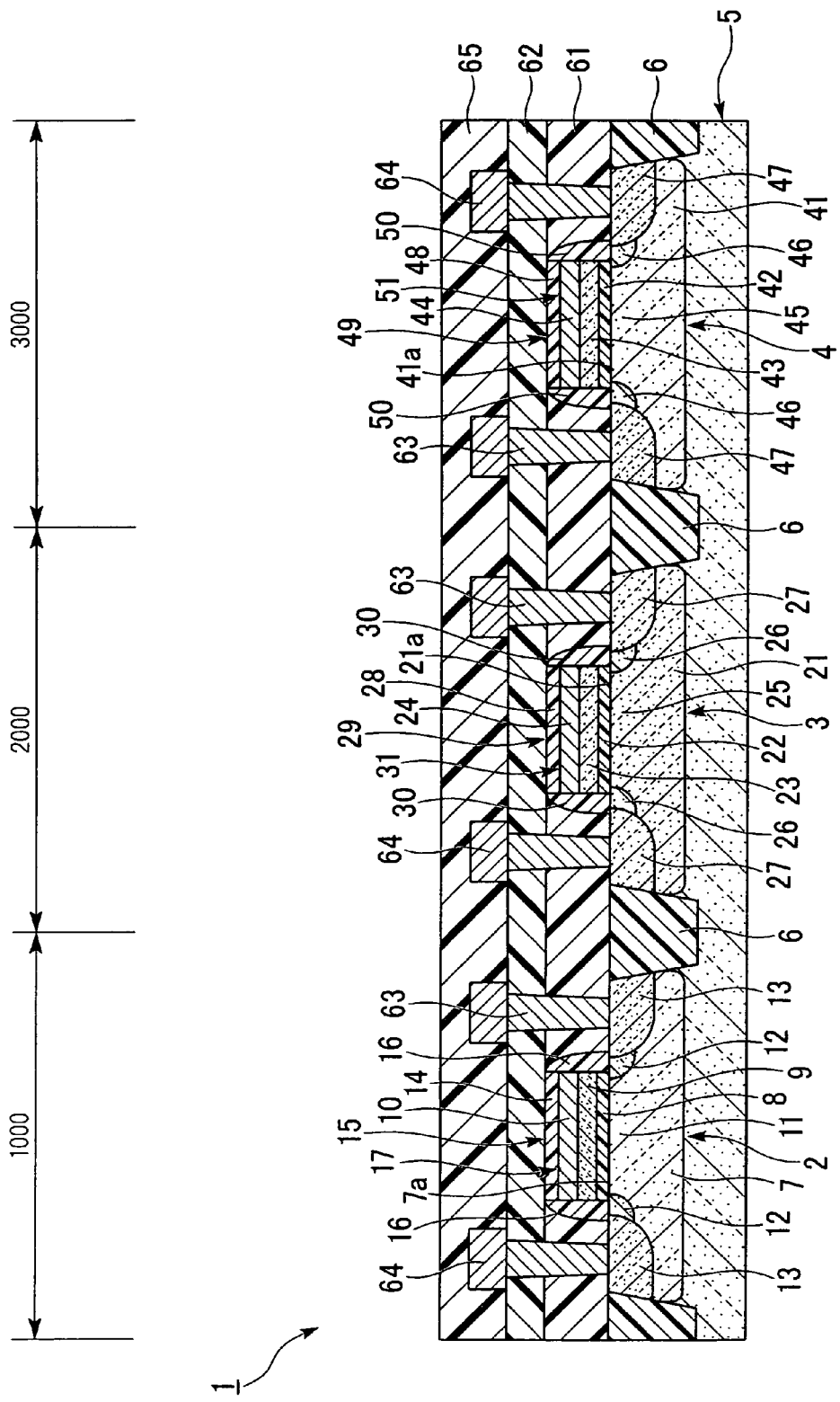
Figure 13:
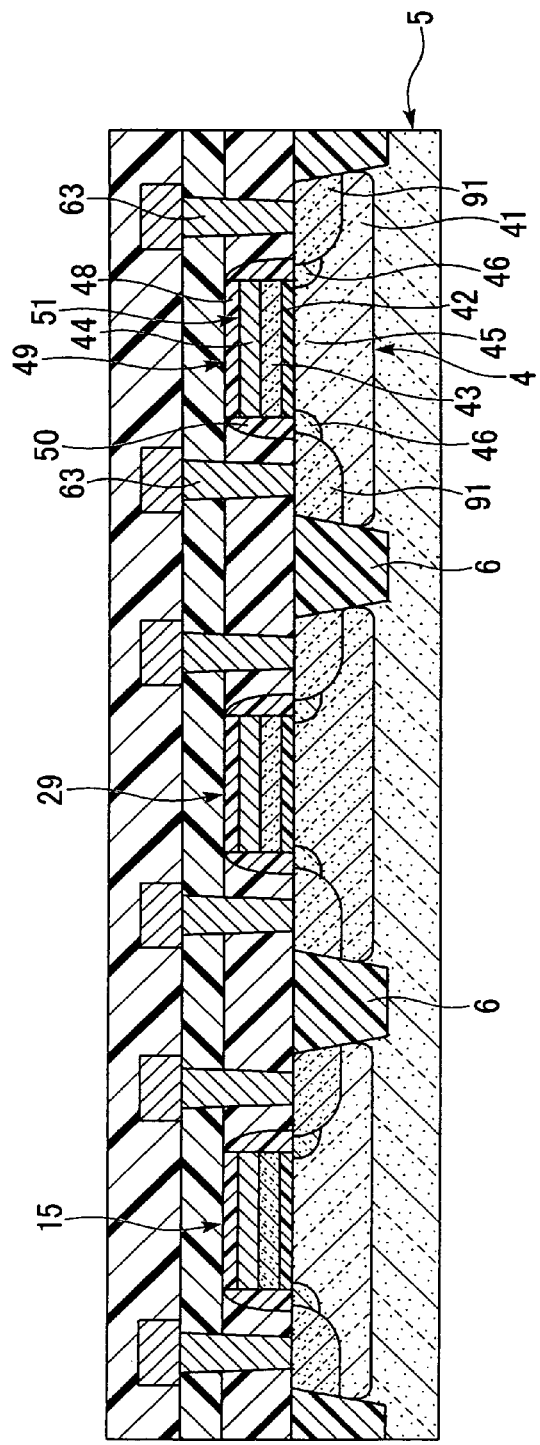
Figure 14:
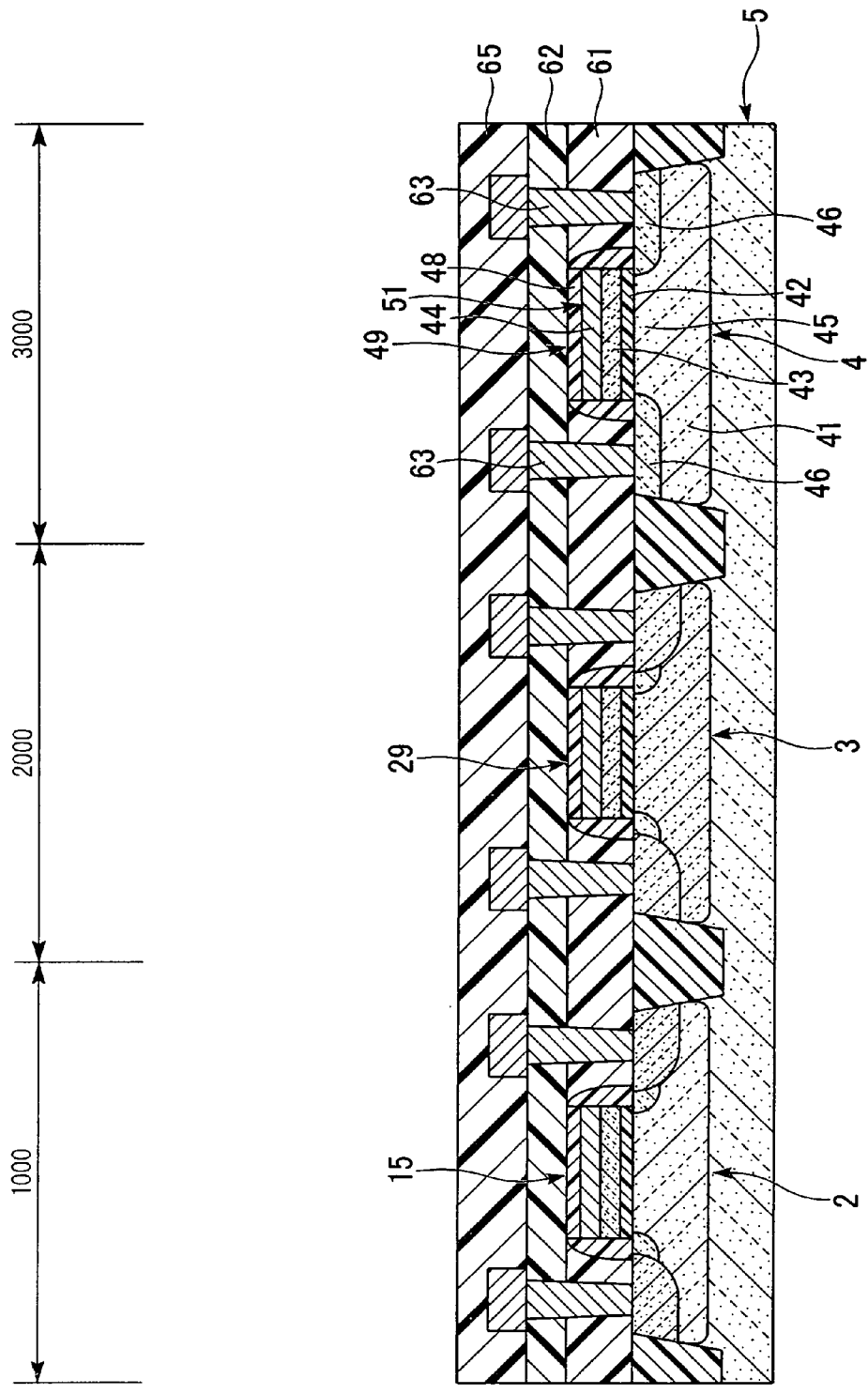
Figure 15:
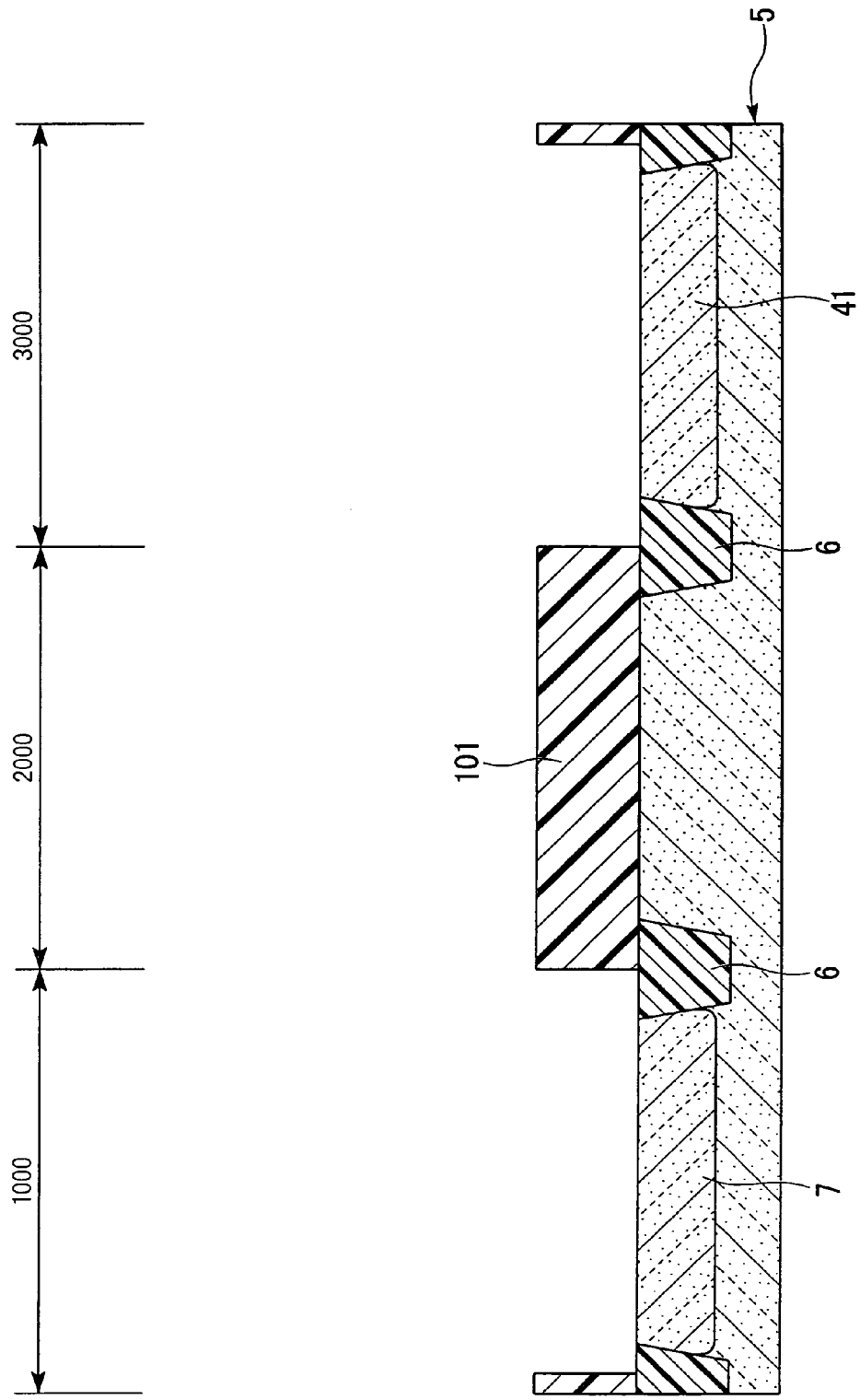
Figure 16:
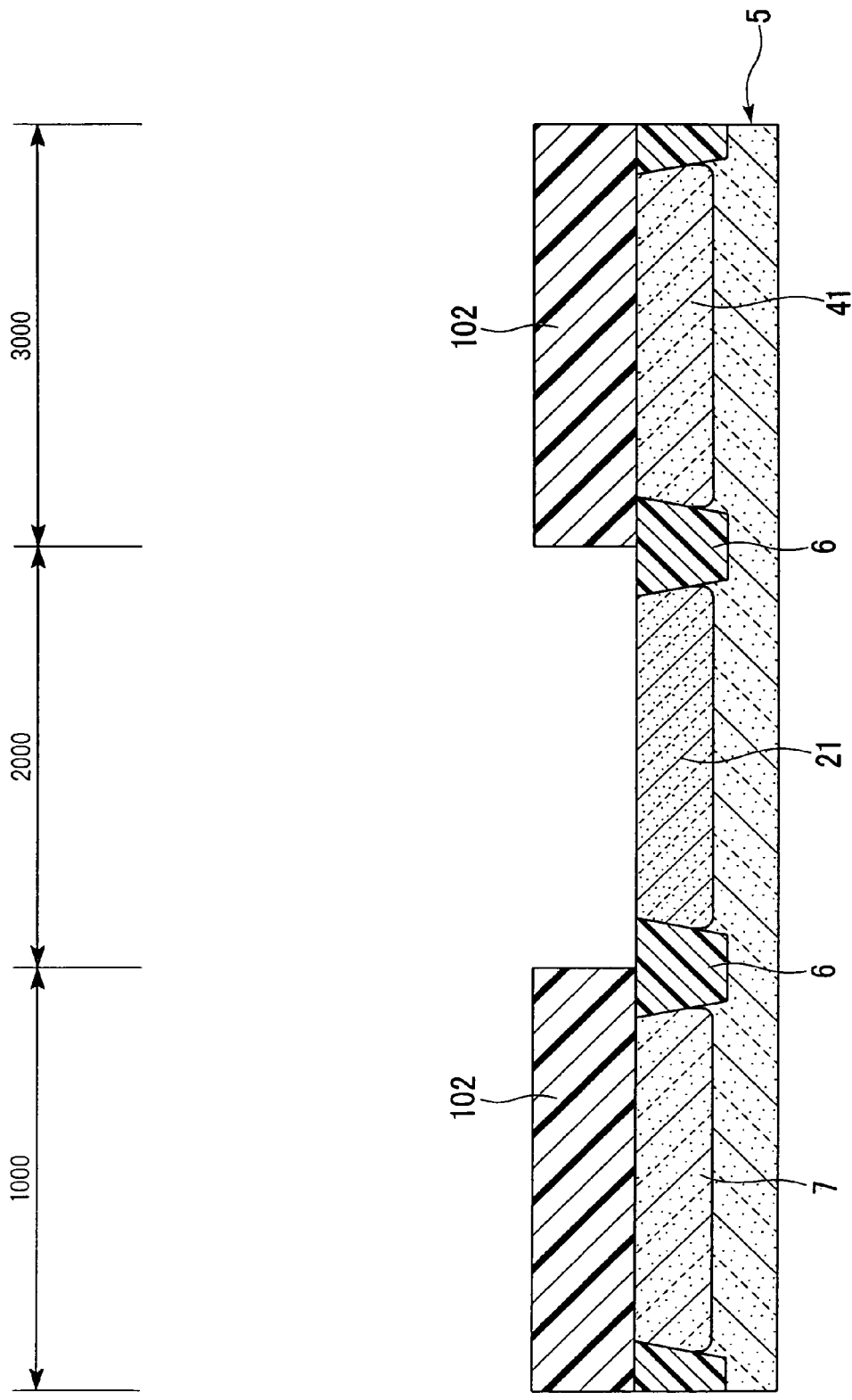
Figure 17:
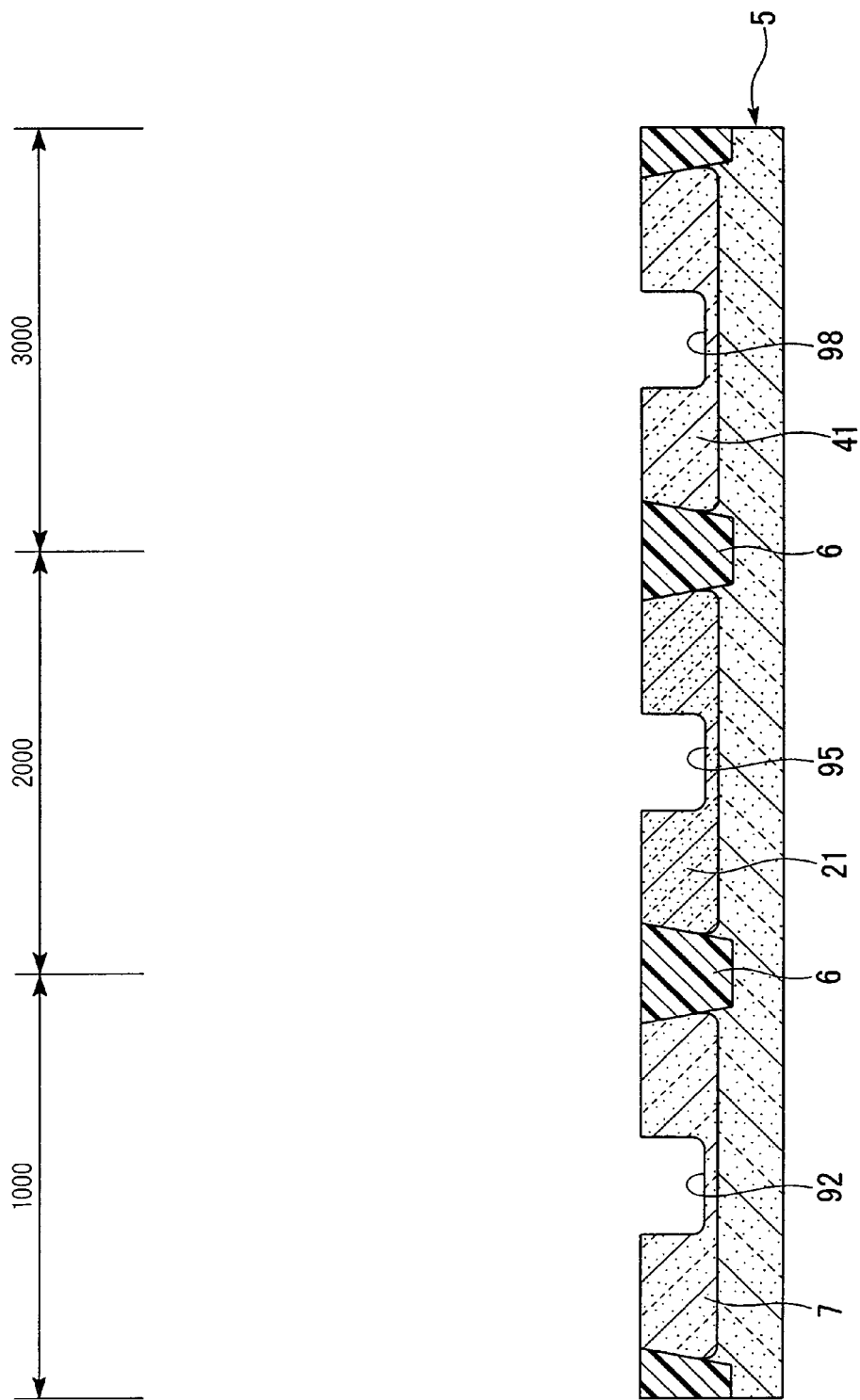
Figure 18:
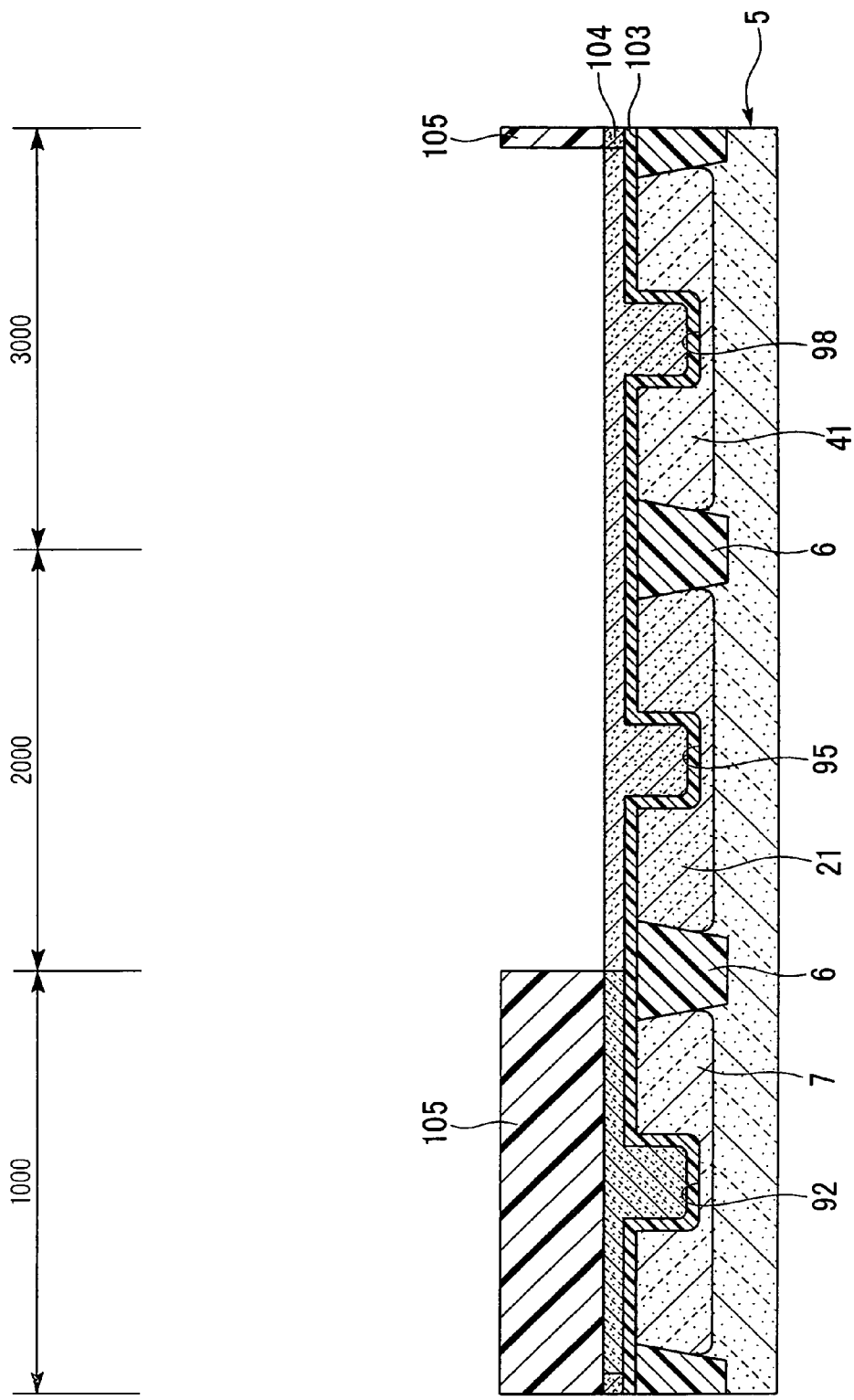
Figure 19:
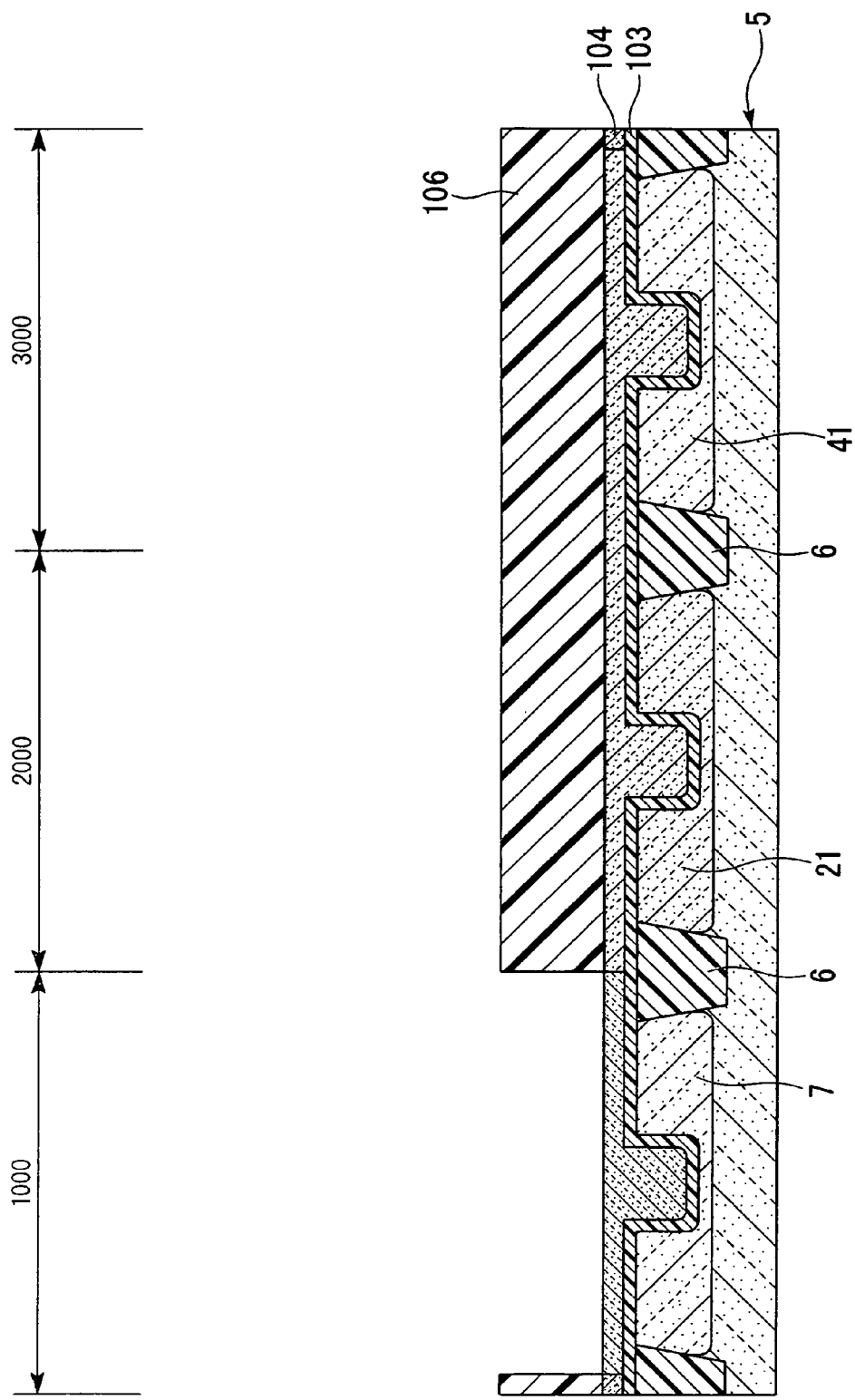
Figure 20:
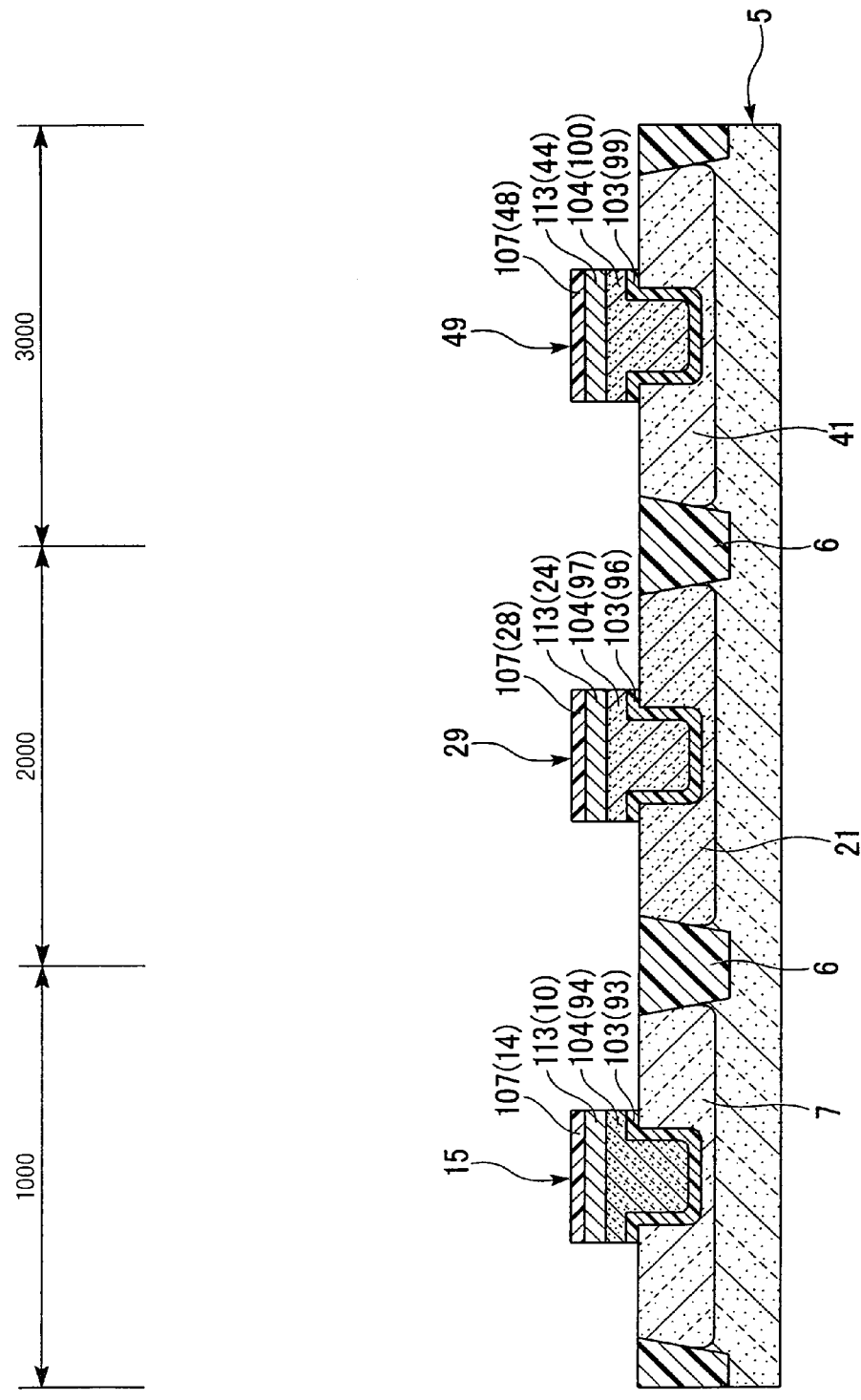
Figure 21:
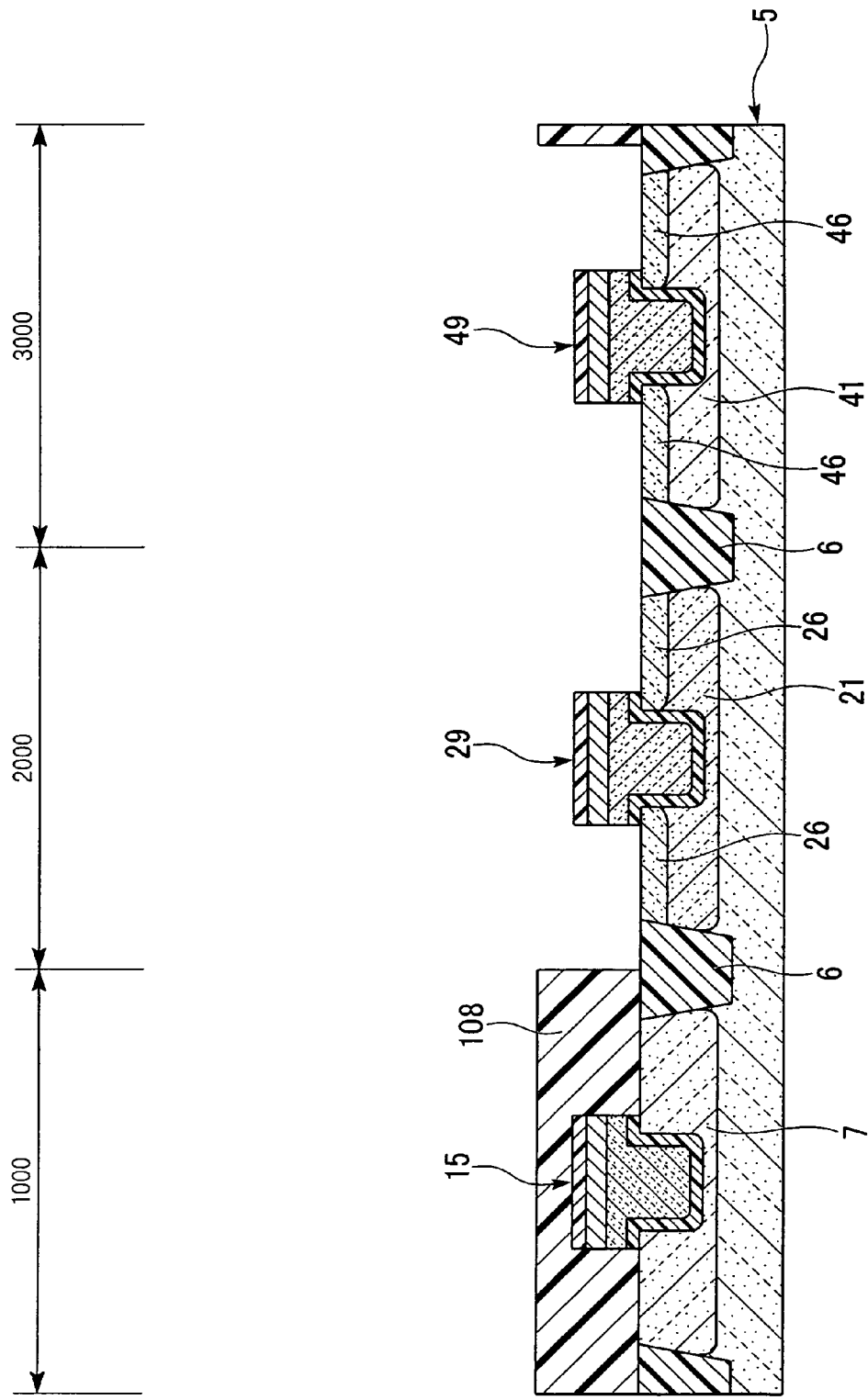
Figure 22:
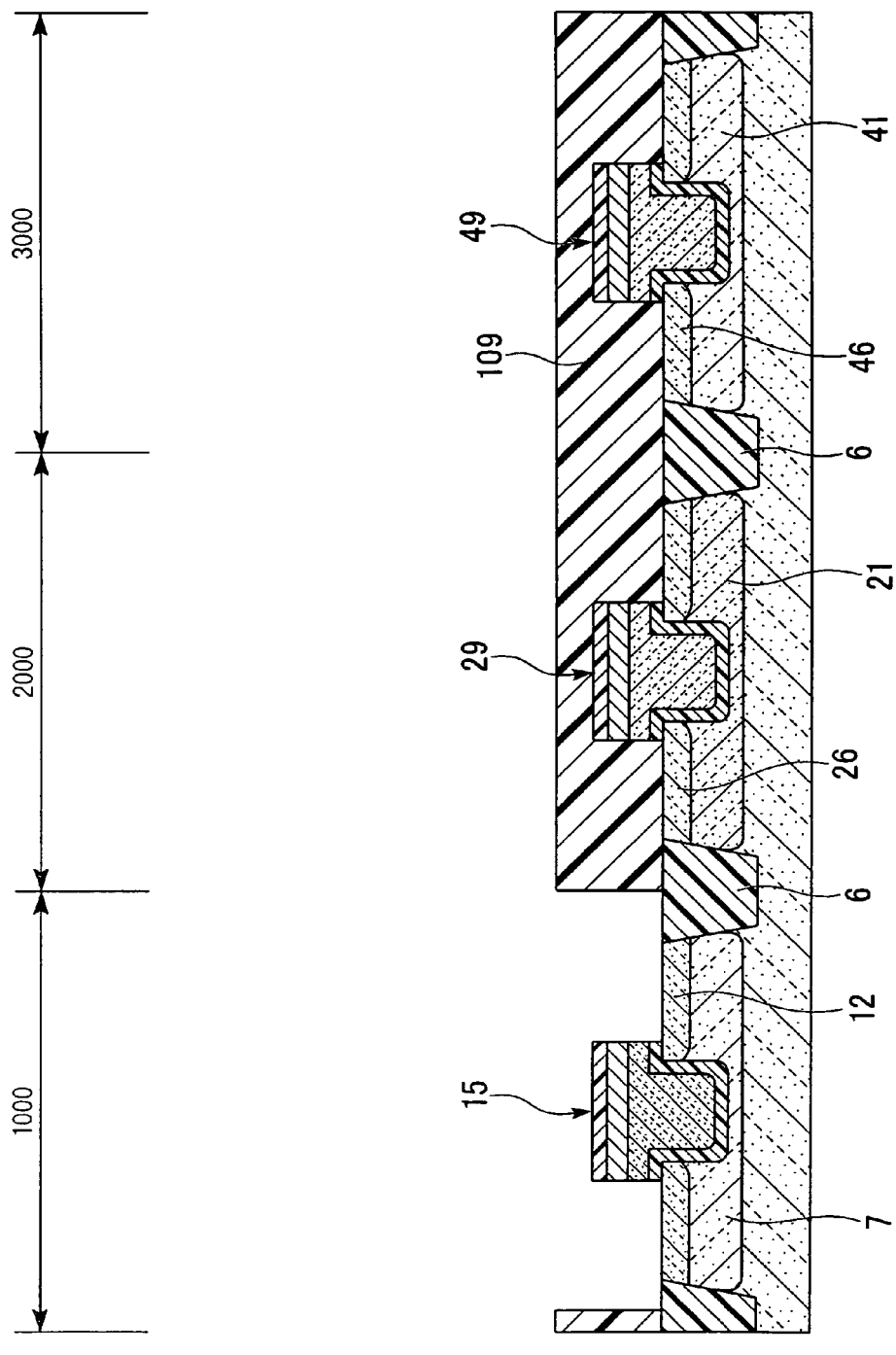
Figure 23:
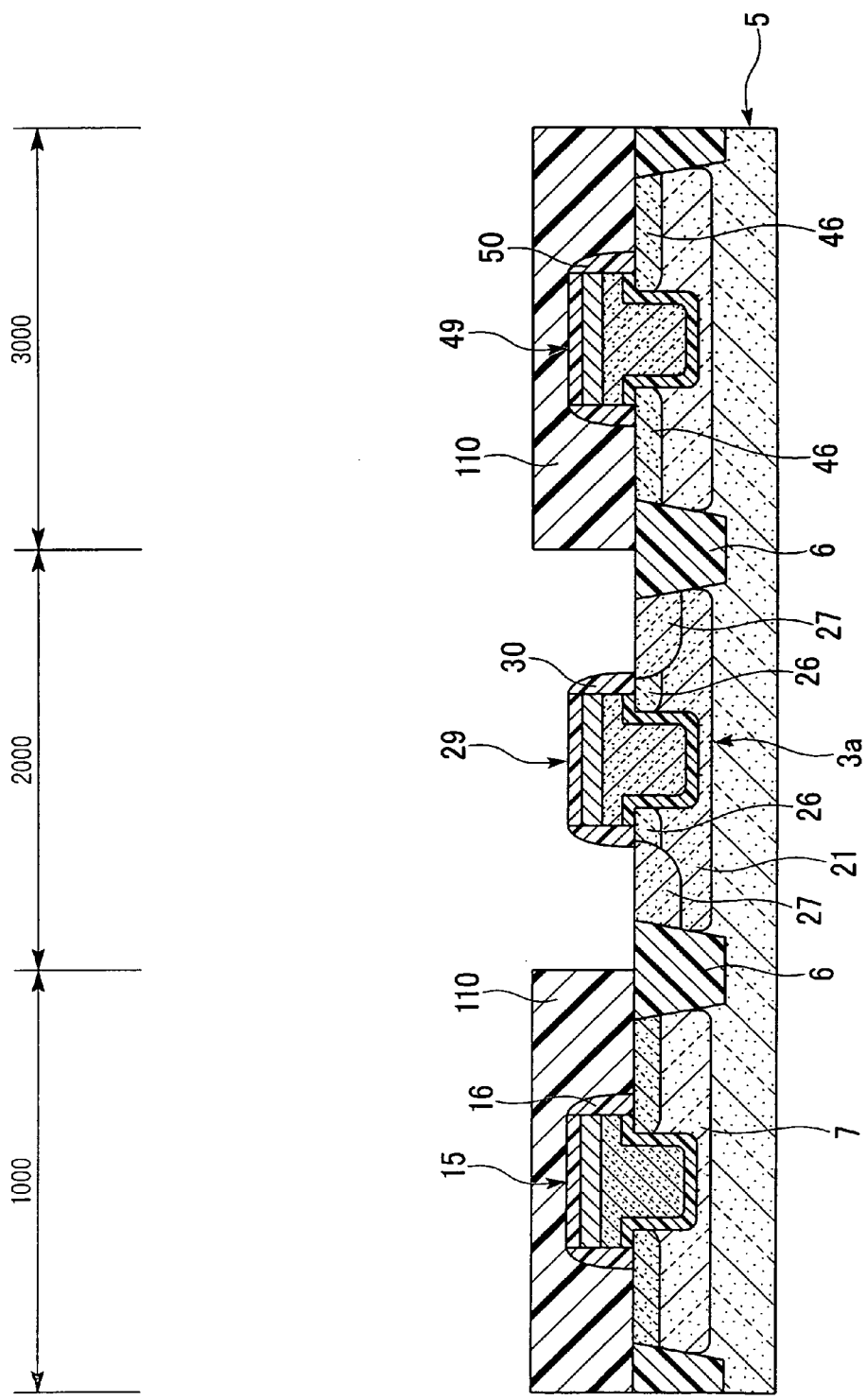
Figure 24:
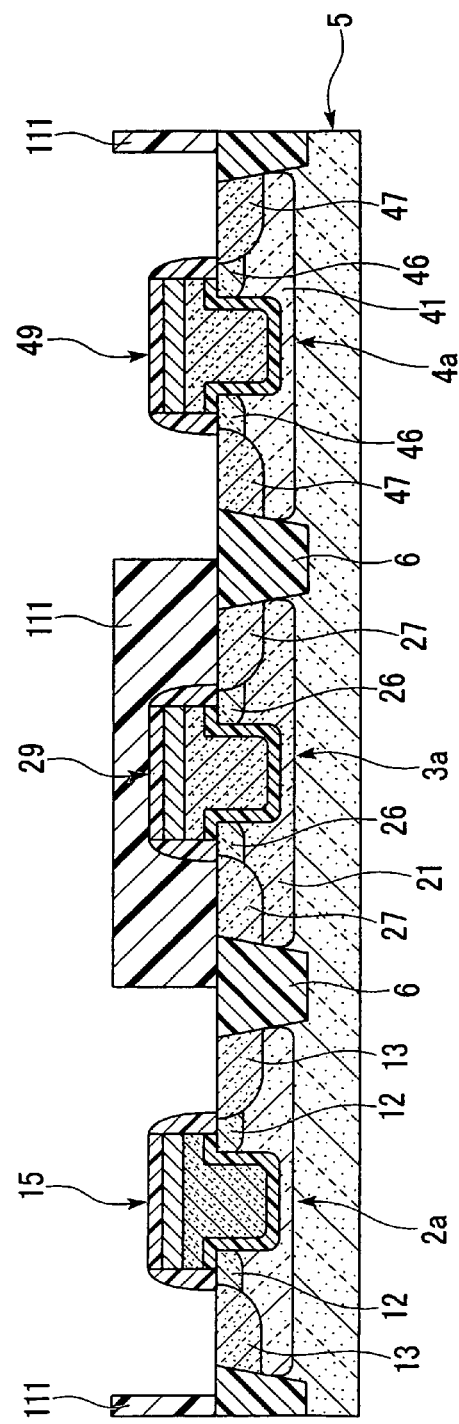
Figure 25:
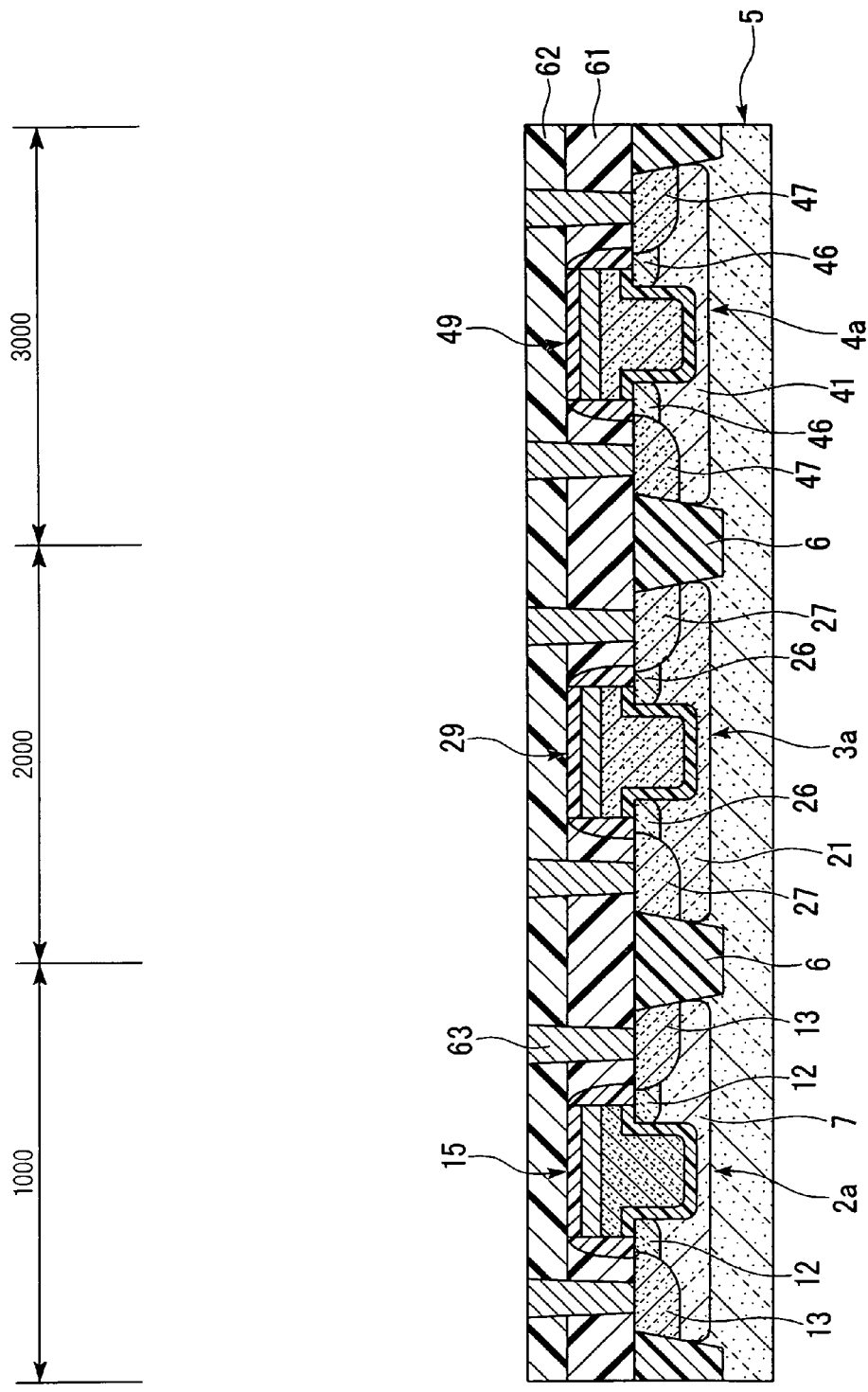
Figure 26:
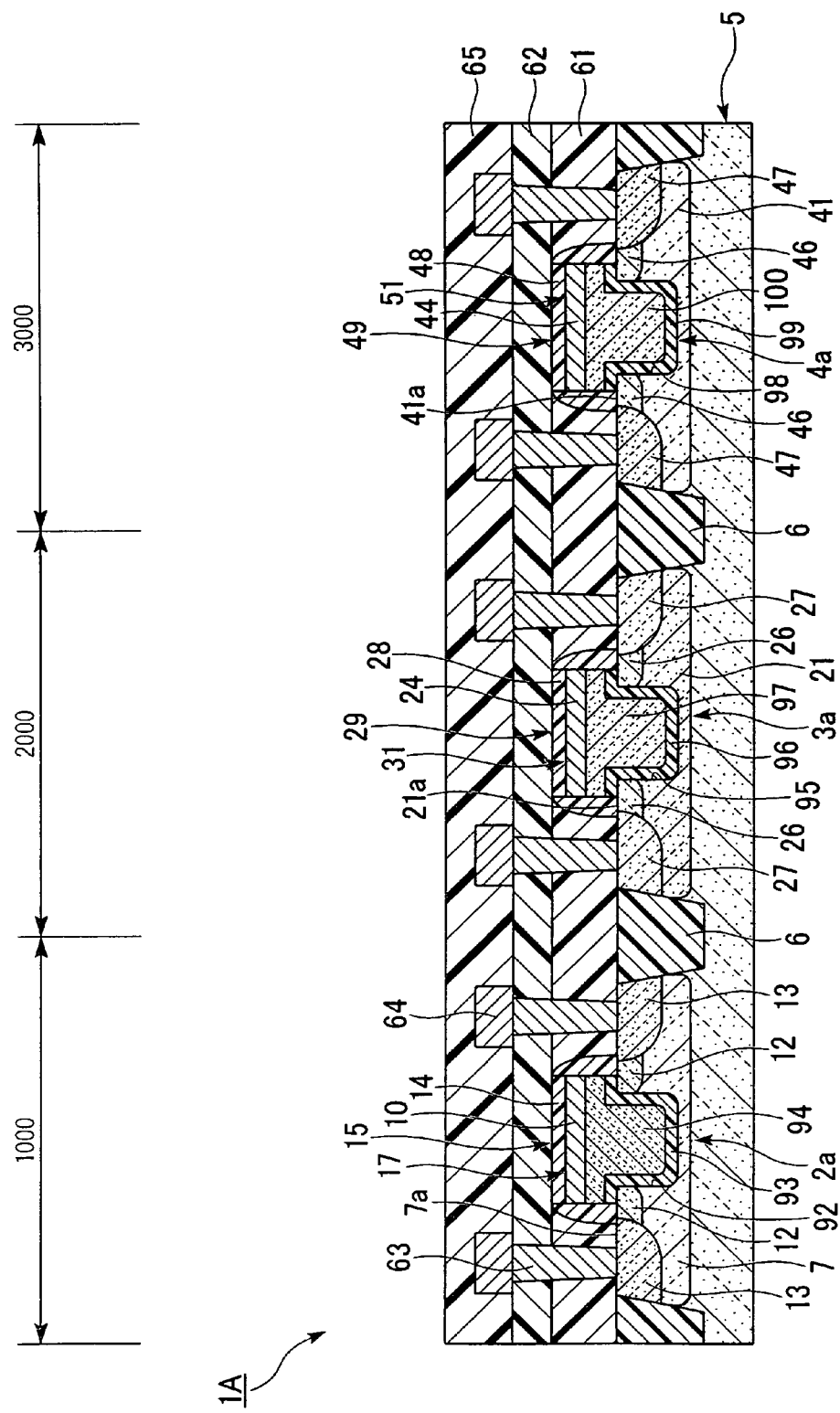
Figure 27:
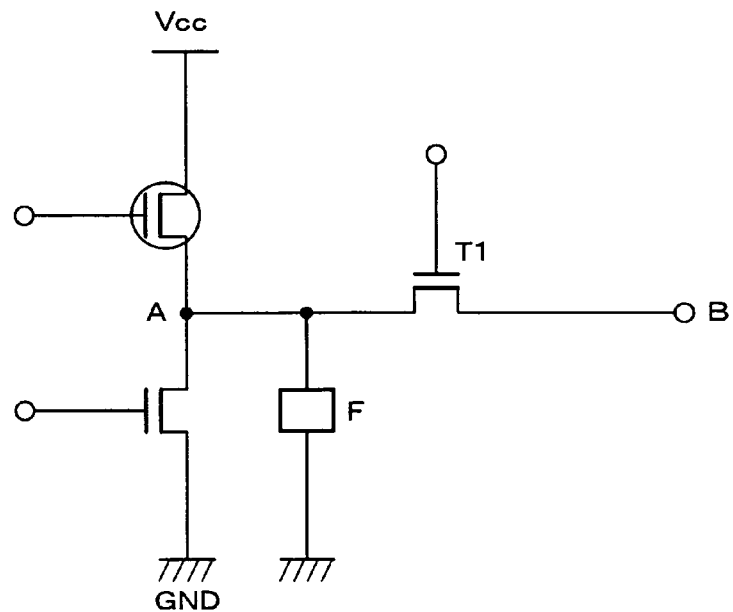
Figure 28:
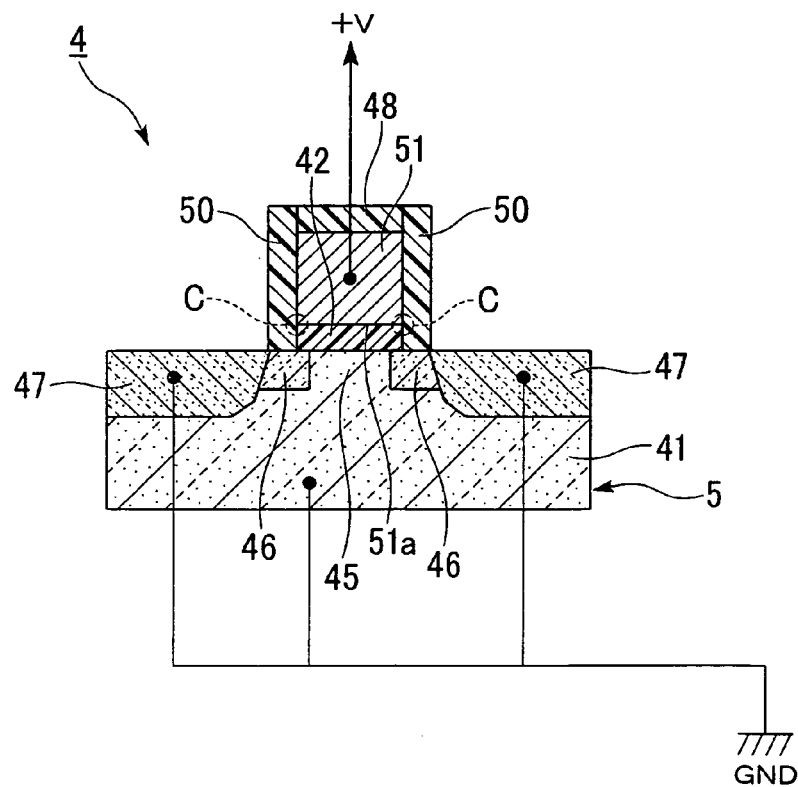

The present invention relates to a semiconductor device tain preferred embodiments taken in conjunction with the accompanying drawings, in which:

FIG. 1 is a fragmentary cross sectional elevation view of illustrating a semiconductor device in a step involved in a method of forming the semiconductor device in accordance with a first preferred embodiment of the present invention;

FIG. 2 is a fragmentary cross sectional elevation view of illustrating a semiconductor device in a step, subsequent to the step of FIG. 1, involved in the method of forming the semiconductor device in accordance with the first preferred embodiment of the present invention;

FIG. 3 is a fragmentary cross sectional elevation view of illustrating a semiconductor device in a step, subsequent to the step of FIG. 2, involved in the method of forming the semiconductor device in accordance with the first preferred embodiment of the present invention;

FIG. 4 is a fragmentary cross sectional elevation view of illustrating a semiconductor device in a step, subsequent to the step of FIG. 3, involved in the method of forming the semiconductor device in accordance with the first preferred embodiment of the present invention;

FIG. 5 is a fragmentary cross sectional elevation view of illustrating a semiconductor device in a step, subsequent to the step of FIG. 4, involved in the method of forming the semiconductor device in accordance with the first preferred embodiment of the present invention;

FIG. 6 is a fragmentary cross sectional elevation view of illustrating a semiconductor device in a step, subsequent to the step of FIG. 5, involved in the method of forming the semiconductor device in accordance with the first preferred embodiment of the present invention;

FIG. 7 is a fragmentary cross sectional elevation view of illustrating a semiconductor device in a step, subsequent to the step of FIG. 6, involved in the method of forming the semiconductor device in accordance with the first preferred embodiment of the present invention;

FIG. 8 is a fragmentary cross sectional elevation view of illustrating a semiconductor device in a step, subsequent to the step of FIG. 7, involved in the method of forming the semiconductor device in accordance with the first preferred embodiment of the present invention;

FIG. 9 is a fragmentary cross sectional elevation view of illustrating a semiconductor device in a step, subsequent to the step of FIG. 8, involved in the method of forming the semiconductor device in accordance with the first preferred embodiment of the present invention;

FIG. 10 is a fragmentary cross sectional elevation view of illustrating a semiconductor device in a step, subsequent to the step of FIG. 9, involved in the method of forming the semiconductor device in accordance with the first preferred embodiment of the present invention;

FIG. 11 is a fragmentary cross sectional elevation view of illustrating a semiconductor device in a step, subsequent to the step of FIG. 10, involved in the method of forming the semiconductor device in accordance with the first preferred embodiment of the present invention;

FIG. 12 is a fragmentary cross sectional elevation view of illustrating a semiconductor device in accordance with the first preferred embodiment of the present invention;

FIG. 13 is a fragmentary cross sectional elevation view of illustrating a modified semiconductor device in accordance with a modification to the first preferred embodiment of the present invention;

FIG. 14 is a fragmentary cross sectional elevation view of illustrating another modified semiconductor device in accordance with another modification to the first preferred embodiment of the present invention;

FIG. 15 is a fragmentary cross sectional elevation view of illustrating a semiconductor device in a step involved in a method of forming the semiconductor device in accordance with a second preferred embodiment of the present invention;

FIG. 16 is a fragmentary cross sectional elevation view of illustrating a semiconductor device in a step, subsequent to the step of FIG. 15, involved in the method of forming the semiconductor device in accordance with the second preferred embodiment of the present invention;

FIG. 17 is a fragmentary cross sectional elevation view of illustrating a semiconductor device in a step, subsequent to the step of FIG. 16, involved in the method of forming the semiconductor device in accordance with the second preferred embodiment of the present invention;

FIG. 18 is a fragmentary cross sectional elevation view of illustrating a semiconductor device in a step, subsequent to the step of FIG. 17, involved in the method of forming the semiconductor device in accordance with the second preferred embodiment of the present invention;

FIG. 19 is a fragmentary cross sectional elevation view of illustrating a semiconductor device in a step, subsequent to the step of FIG. 18, involved in the method of forming the semiconductor device in accordance with the second preferred embodiment of the present invention;

FIG. 20 is a fragmentary cross sectional elevation view of illustrating a semiconductor device in a step, subsequent to the step of FIG. 19, involved in the method of forming the semiconductor device in accordance with the second preferred embodiment of the present invention;

FIG. 21 is a fragmentary cross sectional elevation view of illustrating a semiconductor device in a step, subsequent to the step of FIG. 20 involved in the method of forming the semiconductor device in accordance with the second preferred embodiment of the present invention;

FIG. 22 is a fragmentary cross sectional elevation view of illustrating a semiconductor device in a step, subsequent to the step of FIG. 21, involved in the method of forming the semiconductor device in accordance with the second preferred embodiment of the present invention;

FIG. 23 is a fragmentary cross sectional elevation view of illustrating a semiconductor device in a step, subsequent to the step of FIG. 22, involved in the method of forming the semiconductor device in accordance with the second preferred embodiment of the present invention;

FIG. 24 is a fragmentary cross sectional elevation view of illustrating a semiconductor device in a step, subsequent to the step of FIG. 23, involved in the method of forming the semiconductor device in accordance with the second preferred embodiment of the present invention;

FIG. 25 is a fragmentary cross sectional elevation view of illustrating a semiconductor device in a step, subsequent to the step of FIG. 24, involved in the method of forming the semiconductor device in accordance with the second preferred embodiment of the present invention;

FIG. 26 is a fragmentary cross sectional elevation view of illustrating a semiconductor device in accordance with the second preferred embodiment of the present invention;

FIG. 27 is a circuit diagram illustrating an example of a determination circuit using an antifuse element; and FIG. 28 is a fragmentary schematic cross sectional elevation view of illustrating an antifuse element included in the semiconductor device in accordance with the first embodiment.

DETAILED DESCRIPTION OF THE PREFERRED EMBODIMENTS

Before describing the present invention, the related art will be explained in detail with reference to FIG. 27, in order to facilitate the understanding of the present invention.

The antifuse element described in Japanese Unexamined Patent Application Publication No. 2007-194486 includes a P-type region which has the same impurity concentration as a channel region of a MOS type transistor and is formed in a lower region of a gate insulating film. In general, the impurity concentration of the channel region is set to be significantly low at about $1/100$ to about $1/1000$ of the impurity concentration used in a source/drain region of the MOS type transistor for adjustment of a threshold voltage of the transistor.

As a result, even when the gate electrode is of the same P-type conductivity type in the conductive state of the antifuse element, the impurity concentration is deficient. The resistance value of a conductive path between the gate electrode and a P-type region of a semiconductor substrate results in having a considerably high value which will make it difficult to form a low-resistance conductive path.

When a plurality of antifuse elements is provided, the resistance value has large variations, resulting in the difficulty to stabilize the resistance value of the conductive path.

When the resistance value is high in the conductive state of the antifuse element or when the variation of the resistance value is large, the following phenomena may be caused.

FIG. 27 is a circuit diagram showing an example of a determination circuit using an antifuse element. The determination circuit includes an antifuse element F. The determination circuit also includes a circuit applying a high voltage to the antifuse element F so as to change the conductive state. The circuit applying the high voltage is not shown in FIG. 27. The antifuse element F is set to either the conductive state or the non-conductive state (insulating state).

First, a node A is set to a given potential state (high potential) by an input of a pulse signal at the time of determining the conductive state. As a result, the potential of the node A is lowered to the low level when the antifuse element F is in the conductive state. The potential of the node A is directly maintained in the high state when the antifuse element F is in the non-conductive state.

After a given time has elapsed, a transistor T1 turns ON state. The potential level (high or low level) of a terminal B will cause a circuit being connected to the next stage to perform a given operation.

When the resistance value in the conductive state of the antifuse element F is significantly high, the potential of the node A may not be lowered to the low level in a given time period even though the antifuse element F is placed in the conductive state. This may result in failure operation of the device.

The resistance value has large variations when a plurality of antifuse elements is provided, while the other configurations are the same. This will make it difficult to set the timing of an optimal circuit operation.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, an antifuse element. The antifuse element may include, but is not limited to, a first well of a first conductivity type disposed in a semiconductor substrate; a first insulating film on the first well; a first conductive film of the first conductivity type on the first insulating film; and an impurity-introduced region of the first conductivity type. The impurity-introduced region in the first well is higher in impurity concentration than the first well. The impurity-introduced region includes a first portion that faces toward the first conductive film through the first insulating film.

In some cases, the first conductive film may include, but is not limited to, a second portion that overlaps in plan view the first portion of the impurity-introduced region.

In some cases, the first conductive film may include, but is not limited to, a polysilicon film of the first conductivity type.

In some cases, the first insulating film may have a conductive path between the first portion of the impurity-introduced region and the second portion of the first conductive film.

In some cases, the conductive path may be terminated by the impurity-introduced region.

In these cases, the conductive path may include a semiconductor of the first conductivity type that fills hollows of a pinhole in the first insulating film.

In some cases, the impurity-introduced region is fixed at the same potential as the first well.

In some cases, the impurity-introduced region of the first conductivity type may be higher in impurity concentration by a range of 10 times to 100 times than the first well of the first conductivity type.

In some cases, the semiconductor device may further include, but is not limited to, a first MOS transistor of the first conductivity type, the first MOS transistor having a first gate electrode of the first conductivity type; and a second MOS transistor of the second conductivity type, the second MOS transistor having a second gate electrode of the second conductivity type. The second MOS transistor is disposed in an well of the first conductivity type.

In those cases, the first well may have a groove. The first insulating film and the first conductive film are disposed in the groove.

In another embodiment, a semiconductor device may include, but is not limited to, a semiconductor substrate; a first MOS transistor; a second MOS transistor; and an antifuse element. The first MOS transistor of a first conductivity type may be disposed on the semiconductor substrate. The first MOS transistor may include, but is not limited to, a first well, a first gate insulating film, a first gate electrode, first source and drain regions, and first lightly doped drain regions. The second MOS transistor may include, but is not limited to, a second well, a second gate insulating film, a second gate electrode, second source and drain regions, and second lightly doped drain regions. The first well may be of a second conductivity type. The first MOS transistor may include, but is not limited to, a first channel region of the first MOS transistor. The first gate insulating film may be disposed on the first well. The first gate electrode may include, but is not limited to, a first conductive film. The first gate electrode may be disposed on the first gate insulating film. The first source/drain regions of the first conductivity type may be disposed in the first well. The first lightly doped drain regions of the first conductivity type may be disposed in the first well. The MOS second transistor of the second conductivity type may be disposed on the semiconductor substrate. The second MOS transistor may include, but is not limited to, a second well, a second gate insulating film, a second gate electrode, second source and drain regions, and second lightly doped drain regions. The second well may be of the first conductivity type. The second well may include, but is not limited to, a second channel region of the second MOS transistor. The second gate insulating film may be disposed on the second well. The second gate electrode may include, but is not limited to, a second conductive film. The second gate electrode of the second conductivity type may be disposed on the second gate insulating film. The second source/drain regions of the second conductivity type may be disposed in the second well.

The antifuse element may be disposed on the semiconductor substrate. The antifuse element may include, but is not limited to, a third well, a third insulating film, a third conductive film, an impurity-introduced region. The third well may be of the first conductivity type. The third insulating film may be disposed on the third well. The third conductive film of the first conductivity type may be disposed on the first insulating film. The impurity-introduced region of the first conductivity type may be higher in impurity concentration than the third well.

In some cases, the impurity-introduced region may include, but is not limited to, a first portion that faces toward the third conductive film through the third insulating film.

In some cases, the third well may have a groove. The third insulating film and the third conductive film may be disposed in the groove.

In some cases, the third conductive film may include, but is not limited to, a second portion that overlaps in plan view the first portion of the impurity-introduced region.

In some cases, the third conductive film may include, but is not limited to, a polysilicon film of the first conductivity type.

In some cases, the third insulating film may have a conductive path between the first portion of the impurity-introduced region and the second portion of the first conductive film.

In some cases, the conductive path may include, but is not limited to, semiconductor of the first conductivity type that fills hollows of a pinhole in the third insulating film.

In still another embodiment, a semiconductor device may include, but is not limited to, an antifuse element. The antifuse element may include, but is not limited to, a first well, a first insulating film, a first conductive film, and an impurity-introduced region. The first well may be of a first conductivity type. The first insulating film may be disposed on the first well. The first conductive film may be of the first conductivity type and disposed on the first insulating film. The first impurity region of the first conductivity type may be disposed in the first well. The first impurity region may be higher in impurity concentration than the first well. The second impurity region of the second conductivity type may be disposed in the first well. The second impurity region may be higher in impurity concentration than the first impurity region. The second impurity region may be disposed outside the first impurity region.

In some cases, the first impurity region may include, but is not limited to, a first portion that faces toward the first conductive film through the first insulating film.

In some cases, the first well may have a groove. The first insulating film and the first conductive film may be disposed in the groove.

In yet another embodiment, a method of forming a semiconductor device may include, but is not limited to, the following processes. A semiconductor substrate is prepared. Isolation regions are formed to define first, second and third regions in the semiconductor substrate. A first well is formed in the first region by selectively introducing an impurity of a second conductivity type into the first region. A first gate insulating film is formed over the first well. A first polysilicon film is formed over the first gate insulating film. An impurity of a first conductivity type is introduced into the first polysilicon film. A first lightly doped drain region is formed beside a first surface of the first well by selectively introducing an impurity of the first conductivity into the first well. The first lightly doped drain region is self-aligned to the first polysilicon film. A second well is formed in the second region by selectively introducing an impurity of the first conductivity type into the second region. A second gate insulating film is formed over the second well. A second polysilicon film is formed over the second gate insulating film. An impurity of the second conductivity type is introduced into the second polysilicon film. A second lightly doped drain region is formed beside a first surface of the second well by selectively introducing an impurity of the second conductivity into the second well. The second lightly doped drain region is self-aligned to the second polysilicon film.

A third well is formed in the first region by selectively introducing an impurity of a second conductivity type into the third region. An insulating film is formed over the third well. A third polysilicon film is formed over the insulating film. An impurity of the first conductivity type is introduced into the third polysilicon film. An impurity-introduced region is formed beside a first surface of the third well by selectively introducing an impurity of the first conductivity into the third well. The impurity-introduced region is self-aligned to the third polysilicon film. The impurity-introduced region is higher in impurity concentration than the third well.

In some cases, the first and second wells may be formed simultaneously. The processes for introducing the impurity of the first conductivity type into the second and third polysilicon films are carried out simultaneously. The process for forming the first lightly doped drain regions and the process for forming the impurity-introduced region may be carried out simultaneously.

In some cases, the groove is provided in the third well. The insulating film is formed in the gate groove. The third polysilicon film is formed on the insulating film, so that the third polysilicon film is in the groove.

In some cases, a voltage is applied between the polysilicon film and the impurity-introduced region to break down the insulativity of the insulating film thereby forming a conductive path between the third polysilicon film and the impurity-introduced region in the insulating film.

First Embodiment

Semiconductor Device:

A semiconductor device having an antifuse element will now be described with reference to the drawings.

As shown in FIG. 12, a semiconductor device 1 of this embodiment may include CMOS transistors. The semiconductor device 1 may include a formation region (NMOS region) 1000, a formation region (PMOS region) 2000, and a formation region (antifuse region) 3000. The formation region (NMOS region) 1000 may include an N-type MOS (Metal Oxide Semiconductor) transistor 2 where N-type is a first conductivity type. The formation region (PMOS region) 2000 may include a P-type MOS transistor 3 where P-type is a second conductivity type. The formation region (PMOS region) 2000 may include a formation region (antifuse region) 3000 of an antifuse element 4. FIGS. 1 to 26 are fragmentary cross-sectional elevation views illustrating semiconductor devices, taken along a line perpendicular to gate pattern of the semiconductor devices.

A semiconductor substrate 5 used for the semiconductor device 1 of this embodiment may be, but is not limited to, a P-type semiconductor substrate. The semiconductor substrate 5 may be, but is not limited to, a silicon substrate which has a plurality of trench grooves (not shown) having a given depth of 200 nm. Separation regions 6 are formed by embedding insulating films such as silicon oxide films into trench grooves, so that active regions are isolated.

The N-type MOS transistor 2, the P-type MOS transistor 3, and the antifuse element 4 are isolated by the element separation regions 6.

N-Type MOS Transistor:

The N-type MOS transistor 2 is disposed on the semiconductor substrate 5. The N-type MOS transistor 2 may include a P-type well 7 (first well) including a channel region 11 (first channel forming region), a gate insulating film 8 (first gate insulating film) disposed on the well 7, an N-type polysilicon film 9 (first polysilicon film) disposed on the gate insulating film 8, and a metal film 10 disposed on the polysilicon film 9.

The channel region 11 is disposed on a center portion of a first surface 7a within the well 7. Beside the first surface 7a within the well 7, N-type LDD (Lightly Doped Drain) regions 12 (first LDD regions) are disposed on the outer sides of the opposite ends of the channel region 11.

The P-type well 7 is formed by implanting P-type impurities into the semiconductor substrate 5. It is preferable to use Boron (B) or the like as the P-type impurities.

Beside the first surface 7a within the well 7, N-type diffusion regions 13 are disposed on outside portions of the N-type LDD regions 12. The diffusion regions 13 are disposed at opposite sides of the channel region 11. The LDD region 12 is disposed between the channel region 11 and each of the diffusion regions 13.

The diffusion regions 13 perform as a source region and a drain region of the N-type MOS transistor 2.

The N-type LDD regions 12 are formed by implanting N-type impurities into the well 7. It is preferable to use arsenic (As), phosphorus (P), or the like as the N-type impurities.

The N-type diffusion regions 13 are formed by implanting N-type impurities into the well 7. It is preferable to use arsenic (As) or the like as the N-type impurities. The N-type diffusion region 13 performs as a source/drain region of the N-type MOS transistor 2.

The N-type diffusion regions 13 have the amount of implanted impurities which is larger than the amount of impurities implanted into the N-type LDD regions 12. The N-type diffusion regions 13 contain high-concentration impurities. The N-type LDD regions 12 contain low-concentration impurities. Impurity concentrations of the N-type LDD regions 12 are higher than that of the channel region 11.

A gate pattern 15 is formed by stacking the gate insulating film 8, the N-type polysilicon film 9, the metal film 10, and a silicon nitride film 14 on the channel region 11. For example, sidewalls 16 made of silicon nitride films cover side surfaces of the gate pattern 15.

A silicon oxide film may be used as the gate insulating film 8. In addition to a single-layer silicon nitride film, there may be used a high dielectric film (high-K film) containing hafnium (Hf) or the like or a stacked film of a silicon nitride film and a silicon oxide film.

The N-type polysilicon film 9 is formed by implanting N-type impurities into a polysilicon film having a thickness of 60 nm to 100 nm. It is preferable to use phosphorus (P) as the N-type impurities.

Preferably, the metal film 10 may be a high-melting point metal film. Preferably, a tungsten silicide (WSi) film having a thickness of 5 nm and a tungsten (W) film having a thickness of 45 nm may be formed sequentially.

A gate electrode 17 (first gate electrode) may include, but is not limited to, the polysilicon film 9 and the metal film 10. The polysilicon film 9 is disposed on a lower layer portion of the gate electrode 17. The gate electrode 17 is disposed to face toward the LDD regions 12 and the channel region 11 through the gate insulating film 8.

P-Type MOS Transistor:

The P-type MOS transistor 3 has the same structure as the N-type MOS transistor 2, except for the conductivity type thereof. The P-type MOS transistor 3 is disposed on the semiconductor substrate 5. The P-type MOS transistor 3 may include, but is not limited to, an N-type well 21 (second well) including a channel region 25 (second channel forming region), a gate insulating film 22 (second gate insulating film) disposed on the well 21, a P-type polysilicon film 23 (second polysilicon film) disposed on the gate insulating film 22, and a metal film 24 disposed on the polysilicon film 23.

The channel region 25 is disposed on a center portion of the side of first surface 21a within the well 21. Beside a first surface 21a within the well 21, P-type LDD (Lightly Doped Drain) regions 26 (second LDD regions) are formed on the outer sides of the opposite ends of the channel region 25.

The N-type well 21 is formed by implanting N-type impurities into the semiconductor substrate 5. It is preferable to use phosphorus (P) or the like as the N-type impurities.

Beside the first surface 21a within the well 21, P-type diffusion regions 27 are formed on outside portions of the P-type LDD regions 26. The diffusion regions 27 are disposed at opposite sides of the channel region 25. The LDD region 26 is disposed between the channel region 25 and each of the diffusion regions 27.

The diffusion regions 27 perform as a source region and a drain region of the P-type MOS transistor 3.

The P-type LDD regions 26 are formed by implanting P-type impurities into the well 21. It is preferable to use boron fluoride ($BF_2$), boron (B), or the like as the P-type impurities.

The P-type diffusion regions 27 are formed by implanting P-type impurities into the well 21. It is preferable to use boron fluoride ($BF_2$) or the like as the P-type impurities. The P-type diffusion region 27 performs as a source/drain region of the P-type MOS transistor 3.

The P-type diffusion regions 27 are formed to have the amount of implanted impurities which is larger than the amount of impurities implanted into the P-type LDD regions 26. The P-type diffusion regions 27 are formed to contain high-concentration impurities. The P-type LDD regions 26 are formed to contain low-concentration impurities. Impurity concentrations of the P-type LDD regions 26 are higher than that of the channel region 25.

A gate pattern 29 is formed by stacking the gate insulating film 22, the P-type polysilicon film 23, the metal film 24, and a silicon nitride film 28 on the channel region 25. Sidewalls 30 made of silicon nitride films are formed to cover side surfaces of the gate pattern 29.

A silicon oxide film may be used as the gate insulating film 22. In addition to a single-layer silicon nitride film, there may be used a high dielectric film (high-K film) containing hafnium (Hf) or the like or a stacked film of a silicon nitride film and a silicon oxide film.

The P-type polysilicon film 23 is formed by implanting P-type impurities into a polysilicon film having a thickness of 60 to 100 nm. It is preferable to use boron (B) as the P-type impurities.

Preferably, the metal film 24 may be a high-melting point metal film. Preferably, a tungsten silicide (WSi) film having a thickness of 5 nm and a tungsten (W) film having a thickness of 45 nm may be sequentially formed.

A gate electrode 31 (second gate electrode) may include, but is not limited to, the polysilicon film 23 and the metal film 24. The polysilicon film 23 is disposed on a lower layer portion of the gate electrode 31. The gate electrode 31 faces toward the LDD regions 26 and the channel region 25 through the gate insulating film 22.

Antifuse Element:

An antifuse element 4 has substantially the same structure as the N-type MOS transistor 2. The antifuse element 4 is different from the N-type MOS transistor 2 in that only the conductivity type of polysilicon film and a conductivity type of LDD region are different. Duplicate descriptions will be omitted. Since the transistor operation is not performed in the antifuse element 4, it is not necessarily appropriate to use the name of the gate electrode or the LDD region. However, the same names as in the MOS transistor are used since their parts are formed simultaneously with the MOS transistor as described later.

The antifuse element 4 may have a P-type well 41 (third well) disposed on the semiconductor substrate 5, a gate insulating film 42 (insulating film) disposed on the well 41, a P-type polysilicon film 43 (third polysilicon film) disposed on the gate insulating film 42, and a metal film 44 disposed on the polysilicon film 43.

A channel region 45 is formed on a center portion of the side of a first surface 41a within the well 41. P-type LDD regions 46 (impurity introduction regions) are formed on the outer sides of the opposite ends of the channel region 45 beneath the first surface 41a within the well 41.

The LDD regions 46 are self-aligned with the polysilicon film 43. The LDD regions 46 are in contact with the well 41. The self-alignment process is carried out by using the polysilicon film 43 as a mask for introducing P-type impurities.

The P-type well 41 is formed by implanting P-type impurities into the semiconductor substrate 5. It is preferable to use Boron (B) or the like as the P-type impurities.

Beside the first surface 41a within the well 41, N-type diffusion regions 47 are formed on outside portions of the P-type LDD regions 46. The diffusion regions 47 are disposed at opposite sides of the channel region 45, and the LDD region 46 is disposed between the channel region 45 and each of the diffusion regions 47.

The P-type LDD regions 46 are formed by implanting P-type impurities into the well 41. It is preferable to use boron fluoride ($BF_2$), boron (B), or the like as the P-type impurities.

The N-type diffusion regions 47 are formed to have the amount of implanted impurities which is larger than the amount of impurities implanted into the P-type LDD regions 46. The N-type diffusion regions 47 are formed to contain high-concentration impurities, and the P-type LDD regions 46 are formed to contain low-concentration impurities. Impurity concentrations of the P-type LDD regions 46 are higher than that of the channel region 45 or the impurity concentration of the well 41.

A gate pattern 49 is formed by stacking the gate insulating film 42, the P-type polysilicon film 43, the metal film 44, and a silicon nitride film 48 on the channel region 45. For example, sidewalls 50 made of silicon nitride films are formed to cover side surfaces of the gate pattern 49.

For example, the P-type polysilicon film 43 is formed by implanting P-type impurities into a polysilicon film having a thickness of 60 to 100 nm. It is preferable to use boron (B) as the P-type impurities.

A gate electrode 51 may include, but is not limited to, the polysilicon film 43 and the metal film 44. The gate electrode 51 is disposed to face toward the LDD regions 46 and the channel region 45 through the gate insulating film 42.

In the semiconductor substrate 5, for example, an interlayer insulating film 61 made of a silicon oxide film into which the gate patterns 15, 29, and 49 are embedded is formed. Isolation is made between the gate patterns 15, 29, and 49. An interlayer insulating film 62 made of a silicon oxide film having a thickness of 150 nm to 200 nm is formed on the interlayer insulating film 61.

In the semiconductor device 1, a contact hole (not shown) passing through the interlayer insulating film 61 and the interlayer insulating film 62 is disposed. For example, a conductive film of tungsten (W) or the like is embedded into the contact hole, thereby forming a contact plug 63.

In the semiconductor device 1, a wiring 64 is disposed to be connected to the contact plug 63. It is preferable to use metal such as aluminum (Al), cooper (Cu), tungsten (W), or the like for the wiring 64.

A protective film 65 is disposed to cover the wiring 64. For example, it is preferable to use silicon oxynitride (SiON) for the protective film 65.

The operation of the antifuse element 4 mounted on the semiconductor device 1 of this embodiment will be described.

FIG. 28 is a schematic cross-sectional view showing only main parts of the antifuse element 4 of the semiconductor device 1 of this embodiment. Power for fixing a potential through the P-type semiconductor substrate 5 is fed to the P-type well 41.

When the conductive state of the antifuse element 4 is determined, the P-type well 41 and the N-type diffusion regions 47 are all set as the ground potential (regardless of a fixed negative voltage of −1 V or the like) and a low voltage of an extent to which the gate insulating film 42 is not broken down is applied to the gate electrode 51. In this state, it is possible to determine the conductive state of the antifuse element 4 using the presence/absence of a flowing current. In an initial state, the antifuse element 4 is in a non-conductive state, and no current flows through the gate electrode 51.

When the conductive state is changed, the gate insulating film 42 is broken down by applying a positive voltage to the gate electrode 51 in a state in which the P-type well 41 and the N-type diffusion regions 47 are maintained at the ground potential or fixed negative potential. The positive voltage to the gate electrode 51 is equal to or higher than a withstand voltage of the gate insulating film 42. At this time, a hollow portion of a pinhole shape is generated in the gate insulating film 42. A conductive path is formed. The hollow portion is filled with P-type silicon performing as the gate electrode 51 or the P-type well 41.

In the antifuse element 4, the potentials of the P-type LDD regions 46 and the P-type channel region 45 are all fixed to the same potential as that of the P-type well 41. Here, since impurity concentrations of the LDD regions 46 are set to be higher than that of the channel region 45, the widths of depletion layers generated in the LDD regions 46 is less than that generated in the channel region 45 when the positive voltage has been applied to the gate electrode 51.

Since an electric field (electric force line) from the side surface of the gate electrode 51 is applied to corners C of a bottom 51a of the gate electrode 51, the electric field strength between the gate electrode 51 and the LDD region 46 is greater than that between the gate electrode 51 and the channel region 45. In the gate insulating film 42 located just below the corners C of the gate electrode 51, a breakdown withstand voltage has a tendency to be easily degraded by the effect of dry etching or the like when the gate electrode 51 is patterned.

By the synergy effect thereof, it is possible to selectively form an end portion of the conductive path formed by the breakdown of the gate insulating film 42 on the LDD regions 46 in the antifuse element 4.

Since impurity concentrations of the LDD regions 46 are set to be 10 times to 100 times higher than that of the channel region 45, it is possible to further reduce the electric resistance than the related art when the conductive path is formed between the LDD region 46 and the polysilicon film 43. It is possible to suppress a variation of the resistance value since the conductive path may be stably formed.

Consequently, it is possible to prevent any fault operations since the potential of a node A is swiftly changed even in the case where the semiconductor device is assembled into a determination circuit using the transistors of CMOS configurations shown in FIG. 27. Since variations of the resistance value of each fuse may be suppressed when a plurality of fuses is provided on one semiconductor device, it is possible to prevent any fault operations of the determination circuit.

Manufacturing Method of Semiconductor Device:

The manufacturing method of the semiconductor device 1 of this embodiment will be described.

FIG. 1 is a cross-sectional view showing the formation of the element separation regions 6. In FIG. 1, the formation region (NMOS region) 1000 of the N-type MOS transistor 2, the formation region (PMOS region) 2000 of the P-type MOS transistor 3, and the formation region (antifuse region) 3000 of the antifuse element 4 are disposed in this order as in FIGS. 2 to 26.

First, the P-type semiconductor substrate 5 is prepared and a trench groove (not shown) having a depth of 200 nm is formed in the semiconductor substrate 5. For example, it is preferable to use a P-type silicon substrate as the semiconductor substrate 5.

An insulating film is formed by an HDP-CVD (High Destiny Plasma Chemical Vapor Deposition) method so that the insulating film is embedded into the trench groove. For example, a silicon oxide film ($SiO_2$) is used as the insulating film.

Thereafter, the insulating film on the semiconductor substrate is removed by CMP (Chemical Mechanical Polishing).

By the above process, the element separation regions 6 are formed to partition active regions of the semiconductor substrate.

The P-type wells 7 and 41 are formed as shown in FIG. 2. Specifically, a photoresist film 71 is coated on the semiconductor substrate 5. The photoresist film 71 is patterned, so that the surface of the semiconductor substrate 5 of the NMOS region 1000 and the antifuse region 3000 is exposed.

Thereafter, the P-type wells 7 and 41 are formed by implanting P-type impurities into the semiconductor substrate 5 using the photoresist film 71 as a mask. It is preferable to use boron (B) as the impurities. It is preferable to set a dose of ion implantation in a range of $8 \times 10^{11}$ atoms/cm to $8 \times 10^{13}$ atoms/cm$^2$. For example, it is preferred that the implantation energy should be set in a range of 65 keV to 100 keV.

Additionally, boron of which the implantation energy is set to be high as 200 keV to 250 keV may be additionally implanted. The P-type wells 7 and 41 may be deeply formed.

The bottom positions of the P-type wells 7 and 41 may be lower than those of the element separation regions 6.

After the ion implantation process has been varied out, the photoresist film 71 is removed using organic solvent, plasma ashing, or the like.

The N-type well 21 is formed as shown in FIG. 3.

Specifically, a photoresist film 72 is coated on the semiconductor substrate 5. The photoresist film 72 is patterned, so that the surface of the semiconductor substrate 5 of the PMOS region 2000 is exposed.

Thereafter, the N-type well 21 is formed by implanting N-type impurities into the semiconductor substrate 5 using the photoresist pattern 72 as a mask. It is preferable to use phosphorus (P) as the impurities. It is preferable to set a dose of ion implantation in a range of $2.5 \times 10^{12}$ to $2.5 \times 10^{14}$ atoms/cm$^2$. For example, it is preferred that the implantation energy should be set in a range of 400 keV to 500 keV. Additionally, phosphorus of which the implantation energy is set to be high may be additionally implanted and the N-type well 21 may be deeply formed.

The bottom position of the N-type well 21 may be formed to be lower than those of the element separation regions 6.

After the ion implantation, the photoresist 72 is removed using organic solvent, plasma ashing, or the like.

By the above process, the P-type wells 7 and 41 are formed in the NMOS region 1000 and the antifuse region 3000, and the N-type well 21 is formed in the PMOS region 2000.

In this embodiment, an example in which the N-type well 21 is formed after the P-type wells 7 and 41 are formed has been described, but the N-type well 21 may be first formed.

As shown in FIG. 4, a gate insulating film 73 having a given thickness, for example, a thickness of 5 nm, and a polysilicon film 74 (polycrystalline silicon) having a given thickness, for example, a thickness of 60 to 100 nm, are sequentially formed on the semiconductor substrate 5. However, upon film formation, impurities are not introduced into the polysilicon film 74.

For example, a silicon oxide film may be used as the gate insulating film 73. In addition to a single-layer silicon oxide film, a high dielectric film (high-K film) containing hafnium (Hf) or the like or a stacked film of a silicon nitride film and a silicon oxide film may be used.

A photoresist film 75 is coated on the polysilicon film 74. The photoresist film 75 is patterned, so that the surface of the polysilicon film 74 of the PMOS region 2000 and the antifuse region 3000 is exposed.

Thereafter, P-type impurities are implanted into the polysilicon film 74 using the photoresist pattern 75 as a mask. It is preferable to use boron (B) as the impurities. In terms of ion implantation conditions, it is preferable to set the implantation energy in a range of 3 keV to 5 keV and it is preferable to set a dose in a range of $5 \times 10^{14}$ atoms/cm$^2$ to $5 \times 10^{16}$ atoms/cm$^2$.

Thereby, a boron-doped P-type polysilicon film 74a is formed within the polysilicon film.

As shown in FIG. 5, a photoresist film 76 is coated on the polysilicon film 74. The photoresist film 76 is patterned so that the surface of the polysilicon film 74 of the NMOS region 1000 is exposed.

Thereafter, N-type impurities are implanted into the polysilicon film 74 using the photoresist pattern 76 as a mask. It is preferable to use phosphorus (P) as the impurities. In terms of ion implantation conditions, it is preferable to set the implantation energy in a range of 5 keV to 8 keV and it is preferable to set a dose of ion implantation in a range of $3.6 \times 10^{14}$ atoms/cm$^2$ to $3.6 \times 10^{16}$ atoms/cm$^2$.

Thereby, a phosphorus-doped N-type polysilicon film 74b is formed within the polysilicon film 74.

By the above process, the polysilicon film 74b of the NMOS region 1000 is of N-type. The polysilicon film 74a of the PMOS region 2000 and the antifuse region 3000 is of P-type.

In this embodiment, there has been described an example in which the N-type-doped polysilicon film 74b is formed after the P-type-doped polysilicon film 74a is formed. In other cases, the N-type-doped polysilicon film 74b may be first formed.

As shown in FIG. 6, a metal film 77 is formed on the polysilicon film 74. Preferably, the metal film 77 may be a high-melting point metal film. For example, preferably, a tungsten silicide (WSi) film having a thickness of 5 nm and a tungsten (W) film having a thickness of 45 nm may be sequentially formed.

Thereafter, for example, a silicon nitride film 78 (SiN) having a thickness of 200 nm is formed on the metal film 77.

Thereafter, unnecessary parts are removed by lithography and dry etching, so that the gate insulating films 8, 22, and 42, the polysilicon films 9, 23, and 43, the metal films 10, 24, and 44, and the silicon nitride films 14, 28, and 48 are stacked to form the gate patterns 15, 29, and 49.

As shown in FIG. 7, a photoresist film 81 is coated on the semiconductor substrate 5 including the gate pattern 15. The photoresist film 81 is patterned so that the PMOS region 1000 and the antifuse region 3000 are exposed.

Thereafter, P-type impurities are implanted into the semiconductor substrate 5 using the photoresist pattern 81 as a mask. It is preferable to use boron fluoride ($BF_2$) or boron (B) as the impurities. In terms of ion implantation conditions, it is preferable to set the implantation energy in a range of 2 keV to 4 keV. It is preferable to set a dose in a range of $1.0\times10^{13}$ atoms/cm$^2$ to $8.0\times10^{14}$ atoms/cm$^2$.

Thereby, the LDD regions 26 and 46 are formed on the outer sides of both ends of the channel regions 25 and 45 which are the center portions on one-side surfaces 21a and 41a within the wells 21 and 41. The P-type LDD regions 26 and 46 are self-aligned with the gate patterns 29 and 49.

As shown in FIG. 8, a photoresist film 82 is coated on the semiconductor substrate 5 including the gate patterns 29 and 49. The photoresist film 82 is patterned so that the NMOS region 1000 is exposed.

Thereafter, N-type impurities are implanted into the semiconductor substrate 5 using the photoresist pattern 82 as a mask. It is preferable to use arsenic (As) or phosphorus (P) as the impurities. In terms of ion implantation conditions, it is preferable to set the implantation energy in a range of 2 keV to 4 keV and it is preferable to set a dose in a range of $1.0\times10^{13}$ atoms/cm$^2$ to $8.0\times10^{14}$ atoms/cm$^2$.

Thereby, the LDD regions 12 are formed on the outer sides of the opposite ends of the channel region 11 which is the center portion on the first surface 7a within the well 7. The N-type LDD regions 12 are self-aligned with the gate pattern 15.

By the above process, the N-type LDD regions 12 are formed in the NMOS region 1000, and the P-type LDD regions 26 and 46 are formed in the PMOS region 2000 and the antifuse region 3000.

In this embodiment, an example in which the N-type LDD regions 12 are formed after the P-type LDD regions 26 and 46 are formed has been described, but the N-type LDD regions 12 may be first formed.

Silicon nitride films (not shown) having a given thickness, for example, a thickness of 20 nm, are formed on the gate patterns 15, 29, and 49. Thereafter, an etch-back process is performed to form the sidewalls 16, 30, and 50 which cover the side surfaces of the gate patterns 15, 29, and 49 as shown in FIG. 9.

A photoresist film 83 is coated on the semiconductor substrate 5 including the gate patterns 15 and 49. The photoresist film 83 is patterned so that the PMOS region 2000 of the surface of the semiconductor substrate 5 is exposed.

Thereafter, P-type impurities are implanted into the semiconductor substrate 5 using the photoresist pattern 83 as a mask. It is preferable to use boron fluoride ($BF_2$) as the impurities. In terms of ion implantation conditions, it is preferable to set the implantation energy in a range of 10 keV to 15 keV and it is preferable to set a dose in a range of $2.0\times10^{14}$ atoms/cm$^2$ to $2.0\times10^{16}$ atoms/cm$^2$. At this time, an amount of implanted dose is set to be larger than an amount of dose introduced into the previously formed P-type LDD regions 26.

By the above ion implantation, the high-concentration P-type diffusion regions 27 are formed on the outer sides of the LDD regions 26 on the first surface 21a within the well 21. The P-type diffusion region 27 performs as the source/drain electrode of the P-type MOS transistor 3.

As shown in FIG. 10, a photoresist 84 is coated on the semiconductor substrate 5 including the gate pattern 29, and the NMOS region 1000 and the antifuse region 3000 of the surface of the semiconductor substrate 5 are patterned to be exposed.

Thereafter, N-type impurities are implanted into the semiconductor substrate 5 using the photoresist pattern 84 as a mask. It is preferable to use arsenic (As) as the impurities. In terms of ion implantation conditions, it is preferable to set the implantation energy in a range of 12 keV to 20 keV and it is preferable to set a dose in a range of $3.0\times10^{14}$ atoms/cm$^2$ to $3.0\times10^{16}$ atoms/cm$^2$. At this time, an amount of implanted dose is set to be larger than amounts of dose introduced into the previously formed LDD regions 12 and 46.

By the above ion implantation, the high-concentration N-type diffusion regions 13 and 47 are formed on the outer sides of the LDD regions 12 and 46 on the one-side surfaces 7a and 41a within the wells 7 and 41.

The N-type diffusion region 13 performs as the source/drain electrode of the N-type MOS transistor 2.

By the above process, the N-type diffusion regions 13 and 47 are formed in the NMOS region 1000 and the antifuse region 3000, and the P-type diffusion regions 27 are formed in the PMOS region 2000. In this embodiment, an example in which the N-type diffusion regions 13 and 47 are formed after the P-type diffusion regions 27 are formed has been described, but the N-type diffusion regions 13 and 47 may be first formed.

As shown in FIG. 11, the interlayer insulating film 61 made of a silicon oxide film into which the gate patterns 15, 29, and 49 are embedded is formed and planarized until the surface of the interlayer insulating film 61 is exposed by the CMP method. Subsequently, the interlayer insulating film 62 made of a silicon oxide film having a thickness of 150 nm to 200 nm is formed on the interlayer insulating film 61.

Thereafter, a contact hole (not shown) passing through the interlayer insulating film 61 and the interlayer insulating film 62 is formed by a lithography process and a dry etching process. The contact hole partially exposes an upper surface of the N-type diffusion regions 13 and 47 and the P-type diffusion regions 27.

Thereafter, a conductive film of tungsten (W) or the like is embedded into the contact hole, thereby forming the contact plug 63. Likewise, contact plugs (not shown) connected to the gate electrodes 17, 31, and 51 are formed.

As shown in FIG. 12, the wiring 64 connected to the contact plug 63 is formed. It is preferable to use metal such as aluminum (Al), cooper (Cu), tungsten (W), or the like for the wiring 64.

Thereafter, a protective film 65 is disposed to cover the wiring 64. For example, it is preferable to use silicon oxynitride (SiON) for the protective film 65.

A multilayer wiring structure may be provided by further forming another wiring layer before the protective film 65 is formed. A transistor or a storage element performing as a memory cell region may be provided to form a storage device such as DRAM.

By the above process, the semiconductor device 1 of this embodiment is manufactured.

In a manufacturing method of the semiconductor device 1 of this embodiment, it is possible to form the P-type LDD regions 26 of the general P-type MOS transistor 3 and simultaneously it is possible to form the P-type LDD regions 46 of the antifuse element 4. Other structural elements than the LDD regions 46 of the antifuse element 4 may also be formed in common with a process of manufacturing a general MOS transistor.

Thus, it is possible to manufacture the antifuse element 4 of this embodiment without having to add another process for any semiconductor device having a transistor of a CMOS configuration, and it is possible to suppress manufacturing cost.

In the antifuse element 4 of this embodiment, it is preferred that the P-type channel region 45 and the P-type LDD regions 46 should face toward the gate electrode 51 in which the P-type polysilicon film 43 is provided on a lower layer through the gate insulating film 42. The high-concentration diffusion regions 47 connected to the P-type LDD regions 46 may be of either N- or P-type. For example, as shown in FIG. 13, high-concentration diffusion regions 91 provided in the antifuse element 4 may be P-type diffusion regions.

In this case, when the P-type diffusion regions of the PMOS region 2000 shown in FIG. 9 are formed, it is preferable to also open the pattern of the photoresist 83 even in the antifuse region 3000 and simultaneously introduce P-type impurities by implanting ions into the PMOS region 2000 and the antifuse region 3000.

When the N-type diffusion regions of the NMOS region 1000 shown in FIG. 10 are formed, it is preferable to prevent the photoresist pattern 84 from being opened in the antifuse region 3000 and prevent N-type impurities, which form the N-type diffusion regions, from being introduced into the antifuse region 3000.

Accordingly, it is possible to form the antifuse element 4 without increasing the number of processes.

When the P-type diffusion regions 91 are provided in the antifuse region 3000, power for fixing the potential of the P-type LDD regions 46 may be fed through the contact plugs 63 connected to the P-type diffusion regions 91.

In the antifuse element 4 of this embodiment, the high-concentration diffusion regions 47 may not be provided.

In the antifuse element 4 shown in FIG. 14, only the P-type LDD regions 46 may be disposed, and diffusion regions corresponding to the N-type diffusion regions 13 disposed in the NMOS region 1000 and the P-type diffusion regions 27 disposed in the PMOS region 2000 may not be disposed.

In this case, it is preferable to prevent ion implantation into the antifuse region 3000 by changing the pattern of the photoresist when N- and P-type diffusion regions are formed. Thereby, it is possible to form the antifuse element 4 without increasing the number of processes.

When only the P-type LDD regions 46 are provided in the antifuse region 3000, power for fixing the potential of the P-type LDD regions 46 may be supplied through the contact plugs 63 connected to the P-type LDD regions 46.

In this embodiment, there has been described an example in which the gate electrode 31 having the P-type polysilicon film 23 on the lower layer is formed in the P-type MOS transistor 3 and the gate electrode 17 having the N-type polysilicon film 9 on the lower layer is formed in the N-type MOS transistor 2. In other cases, gate electrodes all having P-type polysilicon films on the lower layers may be formed.

Second Embodiment

Semiconductor Device:

A semiconductor device 1A having an antifuse element 4 as the second embodiment of the present invention will be described. As shown in FIG. 26, the semiconductor device 1A is different from the first embodiment in that MOS transistors are formed in a groove type, not a planar type. Descriptions of the same parts as those of the first embodiment will be omitted.

An N-type MOS transistor 2a of this embodiment may include, but is not limited to, a P-type well 7 disposed on a semiconductor substrate 5, a gate insulating film 93 disposed within a gate trench 92 as a groove disposed in the well 7, an N-type polysilicon film 94 disposed on the gate insulating film 93, and a metal film 10 disposed on the polysilicon film 94. The polysilicon film 94 is designed to have a thickness such that the polysilicon film 94 fills the gate trench 92.

Beside a first surface 7a within the well 7, N-type LDD regions 12 are disposed on the outer sides of the opposite ends of the gate trench 92. N-type diffusion regions 13 are formed on the outer sides of the LDD regions 12. The polysilicon film 94 is disposed beside the LDD regions 12 and above the LDD regions 12 through the gate insulating film 93.

A P-type MOS transistor 3a may include, but is not limited to, an N-type well 21 disposed on the semiconductor substrate 5, a gate insulating film 96 disposed within a gate trench 95 as a groove disposed in the well 21, an N-type polysilicon film 97 disposed on the gate insulating film 96, and a metal film 24 disposed on the polysilicon film 97. The polysilicon film 97 is designed to have a thickness such that the polysilicon film 97 fills the gate trench 95.

Beside a first surface 21a within the well 21, P-type LDD regions 26 are disposed on the outer sides of the opposite ends of the gate trench 95. P-type diffusion regions 27 are formed on the outer sides of the LDD regions 26. The polysilicon film 97 is disposed beside the LDD regions 26 and above the LDD regions 26 through the gate insulating film 96.

An antifuse element 4a may include, but is not limited to, a P-type well 41 disposed on the semiconductor substrate 5, a gate insulating film 99 disposed within a gate trench 98 as a groove disposed in the well 41, a P-type polysilicon film 100 disposed on the gate insulating film 99, and a metal film disposed on the polysilicon film 100. The polysilicon film 100 is designed to have a thickness such that the polysilicon film 100 fills the gate trench 98.

Beside a first surface 41a within the well 41, P-type LDD regions 46 are disposed on the outer sides of the opposite ends of the gate trench 98. N-type diffusion regions 47 are formed on the outer sides of the LDD regions 46. The polysilicon film 100 is disposed beside the LDD regions 46 and above the LDD regions 46 and the gate insulating film 99.

The semiconductor device 1A of this embodiment like the first embodiment is designed so that impurity concentrations of the LDD regions 46 within the well 41 are higher than that of the well 41. When the antifuse element 4a is in the conductive state, a conductive path is formed between the LDD region 46 and the polysilicon film 100, thereby decreasing the electric resistance. It is possible to suppress variations of the resistance value since the conductive path may be stably formed.

Since the polysilicon film 100 is disposed beside the LDD regions 46 and above the LDD regions 46 through the gate insulating film 99, the conductive path between the polysilicon film 100 and the LDD region 46 is easily formed. Thereby, it is possible to further reduce the electric resistance value and it is possible to further suppress a variation of the resistance value.

Manufacturing Method of Semiconductor Device:

The manufacturing method of the semiconductor device of this embodiment will be described. An amount of ion implantation dose is the same as in the first embodiment. Descriptions of the same parts are omitted.

As shown in FIG. 15, the P-type wells 7 and 41 are formed using a resist pattern 101 as a mask in the P-type semiconductor substrate 5 in which element separation regions 6 are provided. As shown in FIG. 16, the N-type well 21 is formed using a resist pattern 102 as a mask.

As shown in FIG. 17, the gate trenches 92, 95, and 98 (groove patterns) are formed within the wells 7, 21 and 41 by a photolithography process and a dry etching process.

As shown in FIG. 18, the gate insulating film 103 and the polysilicon film 104 which does not include impurities are sequentially formed. The polysilicon film 104 is set to have a thickness so that the gate trenches 92, 95, and 98 are completely filled therewith.

P-type impurities are ion-implanted into the polysilicon film 104 of the PMOS region 2000 and the antifuse region 3000 using a photoresist pattern 105 as a mask.

As shown in FIG. 19, N-type impurities are ion-implanted into the polysilicon film 104 of the NMOS region 1000 using a photoresist pattern 106 as a mask. As shown in FIG. 20, a metal film 113 and a silicon nitride film 107 are sequentially formed. Gate electrodes 15, 29, and 49 are patterned.

As shown in FIG. 21, the P-type LDD regions 26 and 46 are formed by ion-implanting P-type impurities into the PMOS region 2000 and the antifuse region 3000 using a photoresist pattern 108 as a mask. As shown in FIG. 22, the N-type LDD regions 12 are formed by ion-implanting N-type impurities into the NMOS region 1000 using a photoresist pattern 109 as a mask.

As shown in FIG. 23, for example, sidewalls 16, 30, and 50 are formed on side portions of the gate electrodes 15, 29, and 49. Thereafter, the P-type diffusion regions 27 are formed by ion-implanting P-type impurities into the PMOS region 2000 using a photoresist pattern 110 as a mask. The P-type diffusion region 27 performs as the source/drain electrode of the P-type MOS transistor 3a.

As shown in FIG. 24, N-type impurities are ion-implanted into the NMOS region 1000 and the antifuse region 3000 using a photoresist pattern 111 as a mask, thereby forming the N-type diffusion regions 13 and 47. The N-type diffusion region 13 performs as the source/drain electrode of the N-type MOS transistor 2a.

As shown in FIG. 25, interlayer insulating films 61 and 62 are formed. Contact plugs 63 connected to the diffusion regions 13, 27, and 47 and contact plugs (not shown) connected to the gate electrodes 17, 31, and 51 are formed.

A wiring 64 connected to the contact plug 63 is formed. A protective film 65 is formed as shown in FIG. 26.

By the above process, the semiconductor device 1A having MOS transistors provided with the groove-type gate electrodes 17, 31, and 51 is formed. In this embodiment, the antifuse element 4a also has a structure having the groove-type gate electrode 51.

Even in the manufacturing method of the semiconductor device 1A of this embodiment like the first embodiment, the manufacturing cost is not increased since the antifuse element 4a may be simultaneously formed in a manufacturing process in common with a manufacturing process of transistors of CMOS configurations having the LDD regions.

Even in this embodiment, it is possible to change the P-type diffusion regions 47 disposed in the antifuse element 4a to N-type or it is possible to provide only the P-type LDD regions 46 without the high-concentration diffusion regions 47.

Various modifications can be made. For example, the case where LDD regions of an antifuse element are of P-type has been described in the above-described embodiment, but the LDD regions may be of N-type. In this case, it is preferred that N-type LDD regions may preferably be formed within an N-type well region. A gate electrode facing toward a gate insulating film may preferably be formed by an N-type polysilicon film. It is preferred that the lowest layer of the gate electrode should be the N-type polysilicon film. In the gate electrode, a metal layer or a metal silicide layer may be stacked on the N-type polysilicon film. All conductivity types of gate electrodes (conductivity types of polysilicon films of lowest layers) may be aligned to a conductivity type of gate electrode formed on a portion of the antifuse element.

Since the above-described embodiments relate to a manufacturing method of a semiconductor device, the above-described embodiments may be widely used for the industry of manufacturing any semiconductor devices.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
    an antifuse element, the antifuse element comprising:
        a first well of a first conductivity type, the first well being disposed in a semiconductor substrate;
        a first insulating film formed directly on the first well;
        a first conductive film of the first conductivity type on the first insulating film; and
        an impurity-introduced region of the first conductivity type in the first well, the impurity-introduced region being higher in impurity concentration than the first well, the impurity-introduced region comprising a first portion that faces toward the first conductive film through the first insulating film.

2. The semiconductor device according to claim 1, wherein the impurity-introduced region further comprises a second portion,
    wherein the first portion is disposed separately from the second portion,
    wherein the second portion faces toward the first conductive film through the first insulating film, and
    wherein the first conductive film comprises an overlapping portion that overlaps in plan view the first portion and the second portion of the impurity-introduced region.

3. The semiconductor device according to claim 2, wherein the first insulating film has a conductive path between the first portion or the second portion of the impurity-introduced region and the overlapping portion of the first conductive film.

4. The semiconductor device according to claim 3, wherein the conductive path is terminated by the impurity-introduced region.

5. The semiconductor device according to claim 3, wherein the conductive path comprises a semiconductor of the first conductivity type that fills hollows of a pinhole in the first insulating film.

6. The semiconductor device according to claim 1, wherein the first conductive film comprises a polysilicon film of the first conductivity type.

7. The semiconductor device according to claim 1, wherein the impurity-introduced region is fixed at the same potential as the first well.

8. The semiconductor device according to claim 1, wherein the impurity-introduced region of the first conductivity type is higher in impurity concentration by a range of 10 times to 100 times than the first well of the first conductivity type.

9. The semiconductor device according to claim 1, further comprising:
- a first MOS transistor of the first conductivity type, the first MOS transistor having a first gate electrode of the first conductivity type; and
- a second MOS transistor of the second conductivity type, the second MOS transistor having a second gate electrode of the second conductivity type,
- wherein the second MOS transistor is disposed in an well of the first conductivity type.

10. The semiconductor device according to claim 9, wherein the first well has a groove, the first insulating film and the first conductive film are disposed in the groove.

11. A semiconductor device comprising an antifuse element, the antifuse element comprising:
- a first well of a first conductivity type;
- a first insulating film formed directly on the first well;
- a first conductive film of the first conductivity type on the first insulating film;
- a first impurity region of the first conductivity type in the first well, the first impurity region being higher in impurity concentration than the first well; and
- a second impurity region of the second conductivity type in the first well, the second impurity region being higher in impurity concentration than the first impurity region,
- wherein the second impurity region is disposed outside the first impurity region.

12. The semiconductor device according to claim 11, wherein the first impurity region comprises a first portion and a second portion that face toward the first conductive film through the first insulating film, and wherein each of the first portion and the second portion of the impurity-introduced region is disposed separately from each other under each side of an edge of the first conductive film.

13. The semiconductor device according to claim 11, wherein the first well has a groove, and the first insulating film and the first conductive film are disposed in the groove.

14. The semiconductor device according to claim 11, wherein each of the first impurity region and the second impurity region is directly in contact with the first well.

15. A semiconductor device comprising an antifuse element, the antifuse element comprising:
- a first impurity region of a first conductivity type;
- an insulating film formed directly on the first impurity region elongating in a first direction;
- a conductive film of the first conductivity type on the insulating film; and
- a second impurity region of the first conductivity type formed in the first impurity region,
- wherein the first impurity region has a top surface and a bottom surface, and the second impurity region has a top surface and a bottom surface; and
- wherein a distance between the top surface and the bottom surface of the second impurity region is smaller than a distance between the top surface and the bottom surface of the first impurity region in a second direction perpendicular to the first direction.

16. The semiconductor device according to claim 15, wherein the second impurity region comprises a first portion and a second portion disposed separately from each other,
- wherein the first portion and the second portion face toward the conductive film through the insulating film, and
- wherein the conductive film comprises an overlapping portion that overlaps in plan view the first portion and the second portion of the second impurity region.

17. The semiconductor device according to claim 16, wherein each of the first portion and the second portion of the second impurity region is disposed under each side of an edge of the conductive film.

18. The semiconductor device according to claim 15, further comprising:
- a third impurity region of a second conductivity type in the first impurity region,
- wherein the third impurity region is disposed outside the first portion and the second portion of the second impurity region.

19. The semiconductor device according to claim 18, wherein the second impurity region is higher in impurity concentration than the first impurity region and the third impurity region is higher in impurity concentration than the second impurity region.

20. The semiconductor device according to claim 15, wherein the first impurity region has a groove, and the insulating film and the conductive film are disposed in the groove.

* * * * *